United States Patent
Yoon et al.

(10) Patent No.: US 8,791,526 B2
(45) Date of Patent: Jul. 29, 2014

(54) VERTICAL TYPE INTEGRATED CIRCUIT DEVICES AND MEMORY DEVICES INCLUDING CONDUCTIVE LINES SUPPORTED BY MESA STRUCTURES AND METHODS OF FABRICATING THE SAME

(75) Inventors: Jae-man Yoon, Hwaseong-si (KR); Hyeong-sun Hong, Seongnam-si (KR); Kwang-youl Chun, Seoul (KR); Makoto Yoshida, Suwon-si (KR); Deok-sung Hwang, Yongin-si (KR); Chul Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 683 days.

(21) Appl. No.: 12/891,910

(22) Filed: Sep. 28, 2010

(65) Prior Publication Data
US 2011/0095350 A1 Apr. 28, 2011

(30) Foreign Application Priority Data
Oct. 22, 2009 (KR) ........................ 10-2009-0100765

(51) Int. Cl.
*H01L 29/66* (2006.01)
(52) U.S. Cl.
USPC ................... 257/334; 257/368; 257/E29.262
(58) Field of Classification Search
USPC .......... 257/327, 329, 330, 334, 368, E27.084, 257/E29.262
See application file for complete search history.

(56) References Cited

U.S. PATENT DOCUMENTS

| | | | |
|---|---|---|---|
| 6,744,087 B2 | 6/2004 | Misewich et al. | |
| 7,074,700 B2 | 7/2006 | Huang et al. | |
| 7,075,146 B2 | 7/2006 | Forbes | |
| 7,229,895 B2 | 6/2007 | Wells | |
| 7,285,812 B2 | 10/2007 | Tang et al. | |
| 7,348,628 B2 | 3/2008 | Yoon et al. | |
| 7,670,909 B2 | 3/2010 | Cho | |
| 2007/0080385 A1* | 4/2007 | Kim et al. | 257/296 |

FOREIGN PATENT DOCUMENTS

| | | |
|---|---|---|
| CN | 1490880 | 4/2004 |
| CN | 1897305 | 1/2007 |
| KR | 100771871 B1 | 10/2007 |

* cited by examiner

*Primary Examiner* — Laura Menz
*Assistant Examiner* — Candice Y Chan
(74) *Attorney, Agent, or Firm* — Myers Bigel Sibley & Sajovec, P.A.

(57) ABSTRACT

A vertical type integrated circuit device includes a substrate and a pillar vertically protruding from the substrate. The pillar includes a lower impurity region and an upper impurity region therein and a vertical channel region therebetween. A portion of the pillar including the lower impurity region therein includes a mesa laterally extending therefrom. The device further includes a first conductive line extending on a first sidewall of the pillar and electrically contacting the lower impurity region, and a second conductive line extending on a second sidewall of the pillar adjacent the vertical channel region. The second conductive line extends in a direction perpendicular to the first conductive line and is spaced apart from the mesa. Related devices and methods of fabrication are also discussed.

14 Claims, 31 Drawing Sheets

FIG. 16C
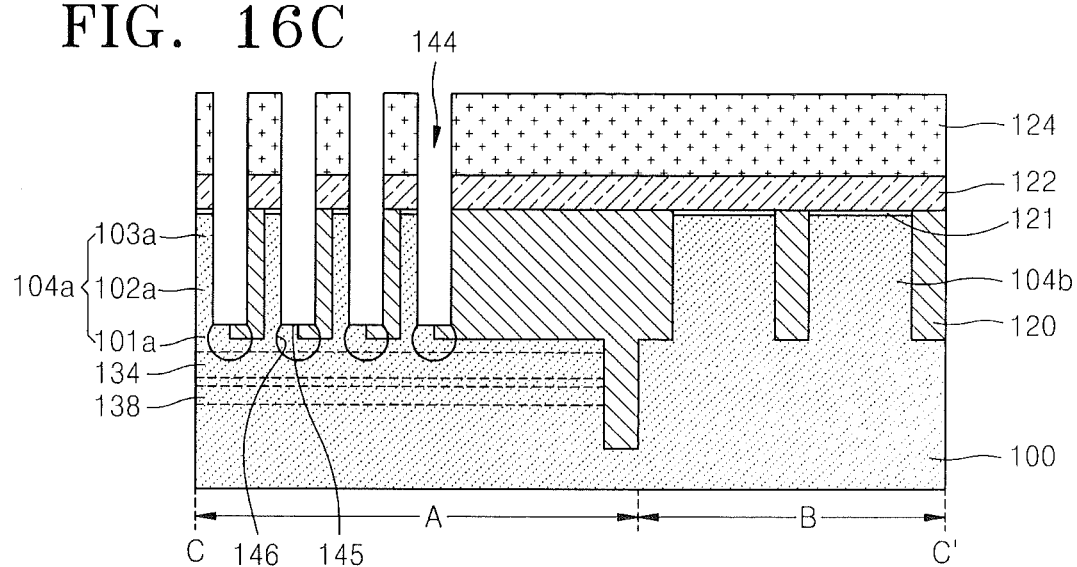
FIG. 16D
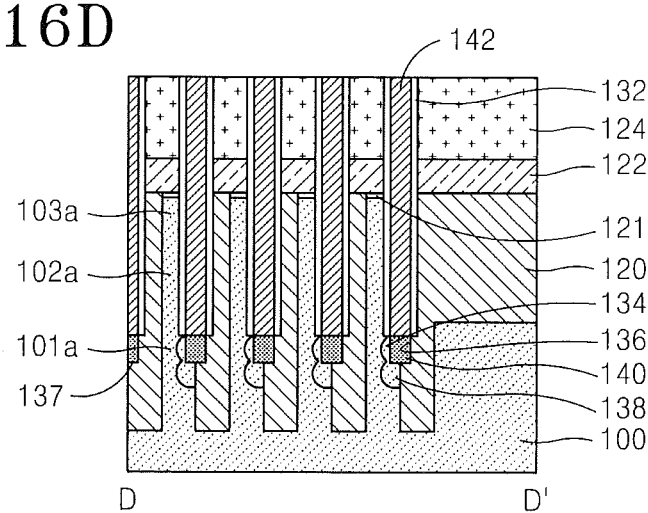
FIG. 16E

VERTICAL TYPE INTEGRATED CIRCUIT DEVICES AND MEMORY DEVICES INCLUDING CONDUCTIVE LINES SUPPORTED BY MESA STRUCTURES AND METHODS OF FABRICATING THE SAME

CROSS-REFERENCE TO RELATED APPLICATIONS

This application claims priority from Korean Patent Application No. 10-2009-0100765, filed on Oct. 22, 2009, in the Korean Intellectual Property Office, the disclosure of which is incorporated by reference herein in its entirety.

BACKGROUND

The inventive concept relates to integrated circuit devices, and more particularly, to vertical type semiconductor devices, memory devices including vertical type semiconductor devices, and methods of fabricating vertical type semiconductor devices and memory devices including the same.

Electronic products are continually expected to meet the competing goals of reduced size and greater data storage and/or processing capacity. Thus, integrated circuit devices used in such electronic products are required to be small and highly integrated. In this regard, research has recently been conducted on vertical type semiconductor devices having a vertical channel structure instead of a conventional planar type structure.

However, it may be difficult to manufacture a vertical type semiconductor device with high performance and high reliability, for example, due to its more complicated manufacturing process.

SUMMARY

Embodiments of the inventive concept provide vertical type integrated circuit devices with high performance and high reliability, and memory devices using the vertical type semiconductor device. Embodiments of the inventive concept also provide methods of manufacturing a semiconductor device and a memory device. However, the inventive concept provides the above-stated technical problems as examples, and technical problems of the inventive concept are not limited thereto.

According to some embodiments, a vertical type integrated circuit device includes a substrate and a pillar vertically protruding from the substrate. The pillar includes a lower impurity region and an upper impurity region therein and a vertical channel region therebetween. A portion of the pillar including the lower impurity region therein includes a mesa laterally extending therefrom. The device further includes a first conductive line extending on a first sidewall of the pillar and electrically contacting the lower impurity region, and a second conductive line extending on a second sidewall of the pillar adjacent the vertical channel region. The second conductive line extends in a direction perpendicular to the first conductive line and is spaced apart from the mesa.

In some embodiments, a cross-sectional area of the lower impurity region may be larger than cross-sectional areas of the vertical channel region and the upper impurity region. For example, a cross-sectional area of the pillar may decrease in a direction away from the substrate.

In some embodiments, the second conductive line may be a word line. A gate insulating layer may extend on the second sidewall between the vertical channel region and the word line. The word line may extend on the mesa, and the gate insulating layer may extend between the mesa and the word line.

In some embodiments, the mesa may be a second mesa, and the portion of the pillar including the lower impurity region may further include a first mesa laterally extending therefrom in the direction perpendicular to the first conductive line. The first conductive line may extend on the first mesa. For example, the first conductive line may be a bit line, and the bit line may directly contact the first mesa.

In some embodiments, the substrate and the pillar may be a same semiconductor material.

In some embodiments, the device may further include a buried insulating layer between the substrate and the pillar. Also, the bit line may extend on the buried insulating layer.

In some embodiments, the bit line may be a first bit line. The device may further include a second bit line extending on a third sidewall of the pillar opposite the first sidewall including the first bit line thereon.

In some embodiments, a storage electrode may be provided on a portion of the pillar including the upper impurity region therein.

In some embodiments, a cell pad may be provided between the portion of the pillar including the upper impurity region and the storage electrode.

In some embodiments, a plurality of pillars may vertically protrude from the substrate along the bit line. The plurality of pillars may respectively include upper and lower impurity regions therein and vertical channel regions therebetween. A plurality of word lines may respectively extend on second sidewalls of respective ones of the plurality of pillars adjacent to the respective vertical channel regions therein. The second conductive line may be one of the plurality of word lines, and the plurality of word lines may extend in the direction perpendicular to the bit line.

In some embodiments, the lower impurity regions of the plurality of pillars may be electrically connected.

In some embodiments, a plurality of pillars may vertically protrude from the substrate along the word line. The plurality of pillars may respectively include upper and lower impurity regions therein and vertical channel regions therebetween. A plurality of bit lines may respectively extend on first sidewalls of respective ones of the plurality of pillars. The first conductive line may be one of the plurality of bit lines, and the plurality of bit lines may extend in the direction perpendicular to the word line.

According to further embodiments, a memory device includes a substrate having a cell region and a peripheral circuit region, a vertical type semiconductor device on the cell region, and a planar type semiconductor device on the peripheral circuit region. The vertical type semiconductor device includes a semiconductor pillar protruding from the cell region in a vertical direction. The semiconductor pillar includes an upper impurity region, a lower impurity region, and a vertical channel region therebetween. A bit line is disposed on a first sidewall of the semiconductor pillar to electrically contact the lower impurity region. A word line is disposed on a second sidewall of the semiconductor pillar adjacent the vertical channel region, and extends in a direction substantially perpendicular to the bit line. A gate insulating layer extends on the second sidewall between the vertical channel region and the word line, and a storage electrode is disposed on the upper impurity region.

In some embodiments, the planar type semiconductor device may include a planar type gate electrode on the peripheral circuit region.

In some embodiments, the planar type gate electrode may be disposed over the word line.

According to still further embodiments, a vertical type semiconductor device includes a substrate, and a semiconductor pillar protruding from the substrate. The pillar includes a lower impurity region and an upper impurity region therein and a vertical channel region therebetween. A base of the pillar includes a first mesa laterally extending therefrom in a first direction and a second mesa laterally extending therefrom in a second direction substantially perpendicular to the first direction, where the first and second mesas include the lower impurity region therein. A bit line on the first mesa electrically contacts the lower impurity region and extends in the second direction. A word line on the second mesa adjacent the vertical channel region extends in the first direction and is spaced apart from the first mesa. A gate insulating layer extends between the vertical channel region and the word line and between the lower impurity region and the word line.

According to other embodiments, a memory device includes a substrate having a cell region and a peripheral circuit region, a vertical type semiconductor device on the cell region, and a planar type semiconductor device on the peripheral circuit region. The vertical type semiconductor device includes a semiconductor pillar extending in a vertical direction on the cell region and comprising a lower impurity region, a vertical channel region on the lower impurity region, and an upper impurity region on the vertical channel region. A bit line is disposed on a first side wall of the lower impurity region to contact the lower impurity region, a word line is disposed on a second side wall of the vertical channel region to extend in a direction perpendicular to the bit line, a gate insulating layer extends between the vertical channel region and the word line, and a storage electrode is disposed on the upper impurity region.

According to still other embodiments, a method of fabricating a vertical type integrated device includes forming a pillar extending in a vertical direction on a substrate. The pillar includes a lower impurity region, a vertical channel region on the lower impurity region, and an upper impurity region on the vertical channel region. A bit line is formed on a first side wall of the lower impurity region to contact the lower impurity region. A gate insulating layer is formed on a second side wall of the vertical channel region. A word line is formed on gate insulating layer to extend in a direction perpendicular to the bit line.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
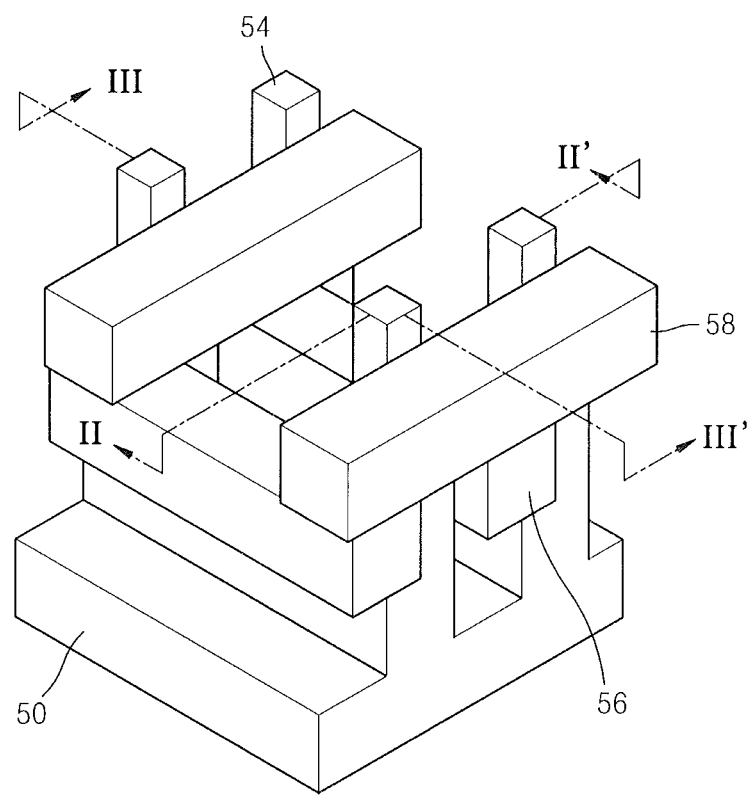
FIG. 1 is a perspective view illustrating a semiconductor device, according to an embodiment of the inventive concept.

Hereinafter, exemplary embodiments of the inventive concept will be described with reference to the accompanying drawings. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to those of ordinary skill in the art. In the drawings, the lengths and sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Figure 2:
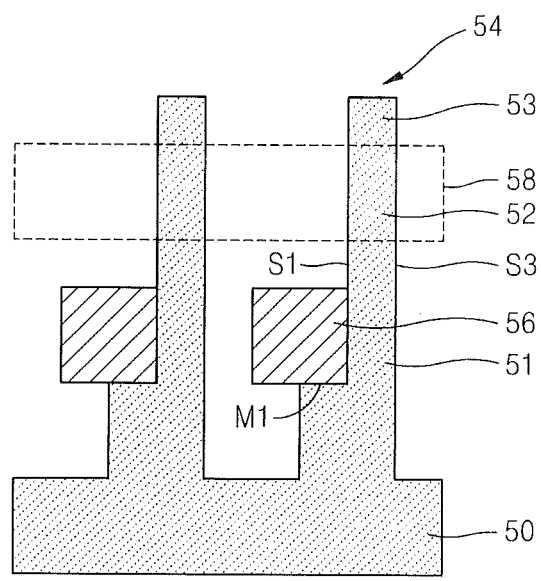
FIG. 2 is a cross-sectional view taken along a line II-II' of the semiconductor device of FIG. 1, according to an embodiment of the inventive concept.
Figure 3:
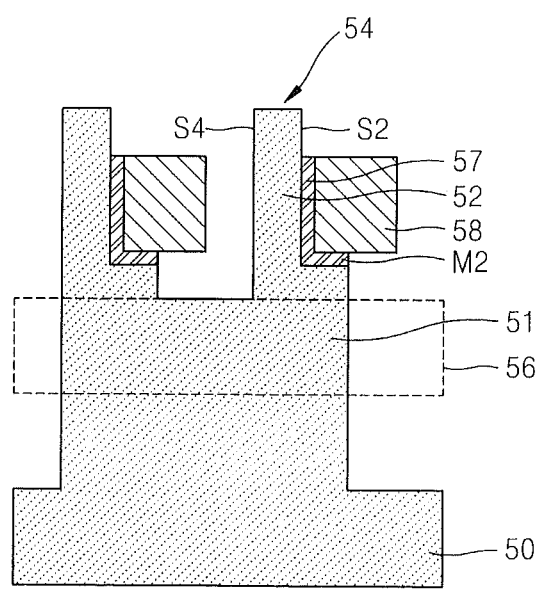
FIG. 3 is a cross-sectional view taken along a line of III-III' the semiconductor device of FIG. 1, according to an embodiment of the inventive concept.

FIG. 1 is a perspective view illustrating a semiconductor device, according to an embodiment of the inventive concept. FIG. 2 is a cross-sectional view taken along a line II-II' of the semiconductor device of FIG. 1. FIG. 3 is a cross-sectional view taken along a line of III-III' the semiconductor device of FIG. 1.

Referring to FIGS. 1 through 3, a substrate 50 is provided, and a plurality of semiconductor pillars 54 are disposed on the substrate 50. The substrate 50 and the semiconductor pillars 54 may be connected to each other. For example, the substrate 50 and the semiconductor pillars 54 may be formed in an integrated structure, for example, by etching a bulk semiconductor wafer. In other embodiments, the substrate 50 and the semiconductor pillars 54 may be separated from each other. The substrate 50 and the semiconductor pillars 54 may include a semiconductor material, for example, a Group IV semiconductor, a Group III-V compound semiconductor, or a Group II-VI oxide semiconductor. For example, the Group IV semiconductor may be silicon, germanium, or silicon-germanium. Alternatively, the semiconductor pillars 54 may be disposed as a semiconductor epitaxial layer on the substrate 50.

The semiconductor pillars 54 may extend or protrude from the substrate 50 in a vertical direction that is, in a direction substantially perpendicular to the substrate surface. In other words, the vertical direction may represent that an angle between a semiconductor pillar 54 and the substrate 50 is greater than about 45 degrees. For example, the semiconductor pillar 54 and the substrate 50 may extend at right angles (e.g., about 90 degrees) relative to one another. In contrast, as used herein, a lateral direction may refer to a direction that is substantially parallel to the substrate surface (and thus, substantially perpendicular to the vertical direction). Each of the semiconductor pillars 54 may include a first side wall S1, a second side wall S2, a third side wall S3, and a fourth side wall S4. The first side wall S1 and the third side wall S3 may be opposed to each other, and the second side wall S2 and the fourth side wall S4 may be opposed to each other.

The semiconductor pillar 54 may include a lower impurity region 51, a vertical channel region 52, and an upper impurity region 53. The vertical channel region 52 may be defined or formed between the lower impurity region 51 and the upper impurity region 53. The lower impurity region 51 and the upper impurity region 53 may form a diode junction with the vertical channel region 52. For example, when the lower impurity region 51 and the upper impurity region 53 are doped with a first conductive impurity, the vertical channel region 52 may be doped with a second conductive impurity which is opposite in conductivity type to the first conductive impurity.

The lower impurity region 51, the vertical channel region 52, and the upper impurity region 53 may be connected to one another in a vertical direction. When the vertical channel region 52 is biased, current flows in a vertical direction, and thus the lower impurity region 51 and the upper impurity region 53 may be electrically connected to each other. For example, the lower impurity region 51 and the upper impurity region 53 may be referred to as a drain region and a source region, or vice versa.

The lower impurity region 51 may include a first mesa part M1 laterally extending from the semiconductor pillar 54. The first mesa part M1 may be formed by etching a part of the first side wall S1. A bit line 56 may be disposed on the first side wall S1 of the lower impurity region 51, and may also be disposed on the first mesa part M1. The bit line 56 may directly contact the first mesa part M1. Thus, the bit line 56 and the lower impurity region 51 may be electrically connected to each other.

The lower impurity region 51 may further include a second mesa part M2 laterally extending from the semiconductor pillar 54. The second mesa part M2 may be formed by etching a part of the second side wall S2, and may extend in a direction substantially perpendicular to that of the first mesa part M1 in some embodiments. The second mesa part M2 may be disposed between the lower impurity region 51 and the vertical channel region 52. A word line 58 may be disposed on the second side wall S2 of the vertical channel region 52, and may also be spaced apart from the second mesa part M2. A gate insulating layer 57 may be continuously formed between the vertical channel region 52 and the word line 58, and between the second mesa part M2 and the word line 58.

A cross-sectional area of the lower impurity region 51 may be larger than cross-sectional areas of the vertical channel region 52 and/or the upper impurity region 53, due to the laterally extending first mesa part M1 and/or second mesa part M2. That is, the cross-sectional area of the semiconductor pillar 54 may decrease as a distance between the semiconductor pillar 54 and the substrate 50 increases in a vertical direction away from the substrate 50.

The semiconductor pillars 54 may be arranged on the substrate 50 to define a matrix array. For example, the lower impurity regions 51 may be connected to one another along the line III-III' and the bit lines 56 may extend along the line III-III'. The lower impurity regions 51 may be spaced apart from one another along the line II-II', and the word lines 58 may extend along the line II-II'. Thus, the bit line 56 and the word line 58 may extend in directions substantially perpendicular to each other, for example, may extend to cross each other at right angles relative to one another.

According to the above-described vertical type semiconductor device, the vertical channel region 52 extends in a direction substantially perpendicular to the substrate 50. Thus, when a turn-on voltage is applied to the word line 58, current may flow between the lower impurity region 51 and the upper impurity region 53. In such a vertical type semiconductor device, a relatively small footprint may be occupied on the substrate 50 due to the vertical array structure of the vertical type semiconductor device, and thus the vertical type semiconductor device may be more easily integrated. Furthermore, as the bit line 56 is disposed to contact the first side wall S1 of the semiconductor pillar 54, the vertical type semiconductor device according to the example embodiment may provide a relatively low resistance structure in which a cross-sectional area of the vertical type semiconductor device is wider and less complex than a structure in which the bit line 56 surrounds the semiconductor pillar 54. Accordingly, such vertical type semiconductor devices may be used in products to provide relatively high reliability and high performance.

Figure 4:
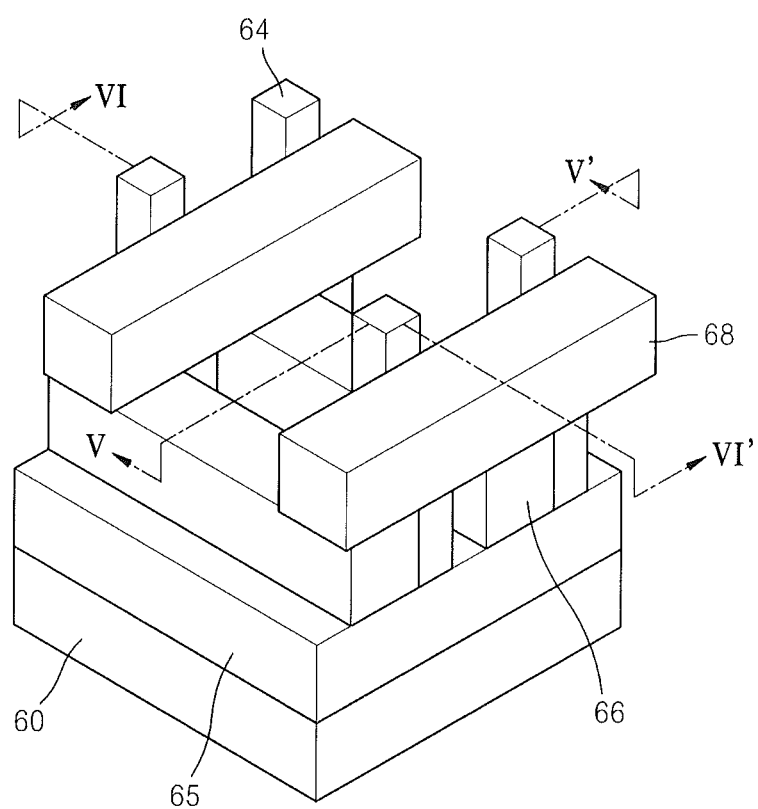
FIG. 4 is a perspective view illustrating a semiconductor device, according to another embodiment of the inventive concept.
Figure 5:
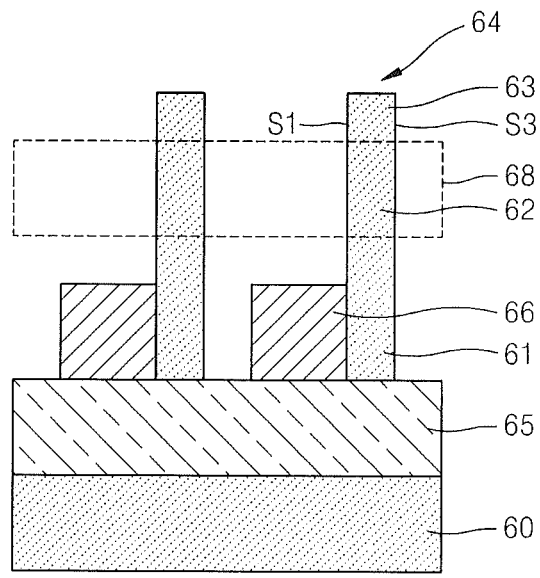
FIG. 5 is a cross-sectional view taken along a line V-V' of the semiconductor device of FIG. 4, according to an embodiment of the inventive concept.
Figure 6:
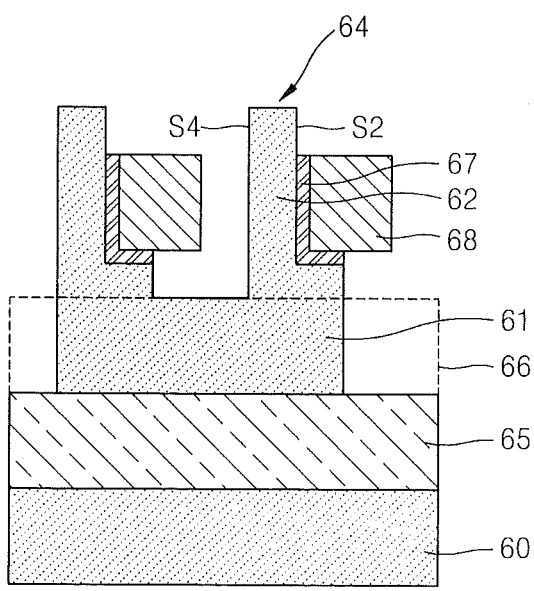
FIG. 6 is a cross-sectional view taken along a line VI-VI' of the semiconductor device of FIG. 4, according to an embodiment of the inventive concept.

FIG. 4 is a perspective view illustrating a semiconductor device, according to another embodiment of the inventive concept. FIG. 5 is a cross-sectional view taken along a line V-V' of the semiconductor device of FIG. 4. FIG. 6 is a cross-sectional view taken along a line VI-VI' of the semiconductor device of FIG. 4.

Referring to FIGS. 4 through 6, a substrate 60 is provided, and a plurality of semiconductor pillars 64 extending in a vertical direction are provided on the substrate 60. Each of the semiconductor pillars 64 may include a lower impurity region 61, a vertical channel region 62, and an upper impurity region 63. The substrate 60 and the semiconductor pillars 64 may be similar to the substrate 50 and the semiconductor pillars 54 of FIGS. 1 through 3, respectively. However, the semiconductor pillars 64 may be spaced apart from the substrate 60. For example, a buried insulating layer 65 may be disposed between the substrate 60 and the semiconductor pillars 64. For example, the semiconductor pillars 64 may be provided as a semiconductor epitaxial layer. A silicon-on-insulator (SOI) wafer may be etched to form a structure in which the semiconductor pillars 64 and the buried insulating layer 65 are sequentially stacked on the substrate 60 in the order stated, such that the pillars 64 are electrically isolated from the substrate 60.

A bit line 66 may be disposed on the buried insulating layer 65 and on a first side wall S1 of the lower impurity region 61, and may be similar to the bit line 56 of FIGS. 1 through 3. A word line 68 may be disposed on a second side wall S2 of the vertical channel region 62, and may be similar to the word line 58 of FIGS. 1 through 3. A gate insulating layer 67 may be disposed between the word line 68 and the vertical channel region 62 and between the word line 68 and the lower channel region 61.

Figure 7:
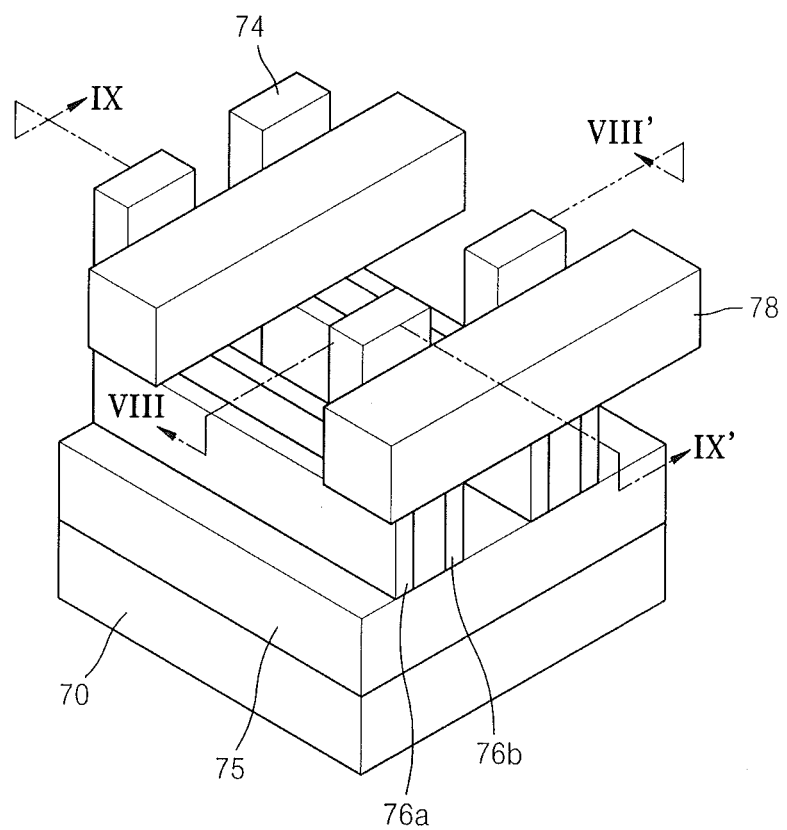
FIG. 7 is a perspective view illustrating a semiconductor device, according to another embodiment of the inventive concept.
Figure 8:
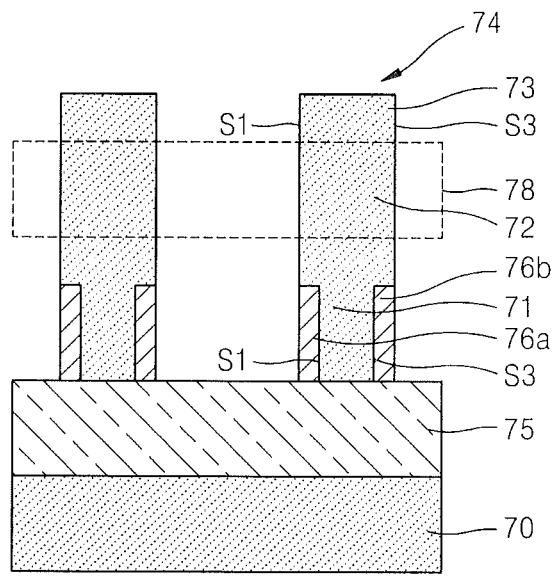
FIG. 8 is a cross-sectional view taken along a line VIII-VIII' of the semiconductor device of FIG. 7, according to an embodiment of the inventive concept.
Figure 9:
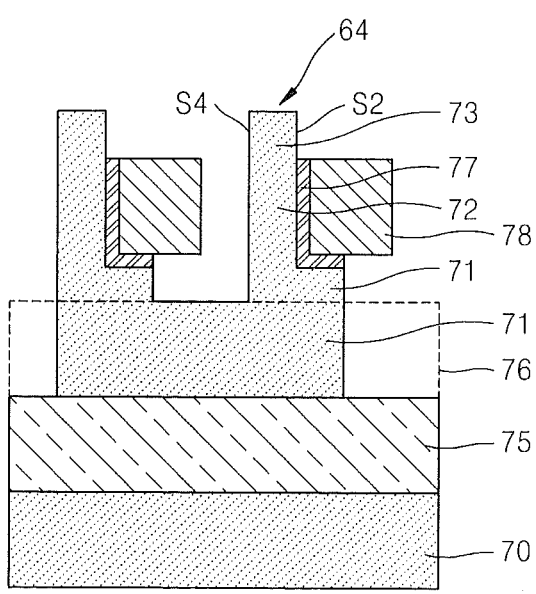
FIG. 9 is a cross-sectional view taken along a line IX-IX' of the semiconductor device of FIG. 7, according to an embodiment of the inventive concept.

FIG. 7 is a perspective view illustrating a semiconductor device, according to another embodiment of the inventive concept. FIG. 8 is a cross-sectional view taken along a line VIII-VIII' of the semiconductor device of FIG. 7. FIG. 9 is a cross-sectional view taken along a line IX-IX' of the semiconductor device of FIG. 7.

Referring to FIGS. 7 through 9, a substrate 70 is provided, and a plurality of semiconductor pillars 74 extending in a vertical direction are provided on the substrate 70. Each of the semiconductor pillars 74 may include a lower impurity region 71, a vertical channel region 72, and an upper impurity region 73. A buried insulating layer 75 may be disposed between the substrate 70 and the semiconductor pillars 74. The substrate 70, the buried insulating layer 75, and the semiconductor pillars 74 may be similar to the substrate 60, the buried insulating layer 65, and the semiconductor pillars 64 of FIGS. 4 through 6, respectively.

A first bit line 76a may be disposed on a first side wall S1 of the lower impurity region 71, and a second bit line 76b may be disposed on a third side wall S3 of the lower impurity region 71. The first bit line 76a and the second bit line 76b on the buried insulating layer 75 may directly contact the lower impurity region 71.

A word line 78 may be disposed on a second side wall S2 of the vertical channel region 72, and may refer to the word line 58 of FIGS. 1 through 3. A gate insulating layer 77 may be disposed between the word line 78 and the vertical channel region 72, and between the word line 78 and the lower channel region 71.

The above-described semiconductor devices according to embodiments of the inventive concept may be used in various products. For example, the semiconductor devices may be used as a control device of various logic devices and/or as a memory transistor or a control device of various memory devices. The memory device may include a dynamic random access memory (DRAM), a static random access memory (SRAM), a magnetic random access memory (MRAM), a ferroelectric random access memory (FeRAM), a resistive RAM (ReRAM), a phase-change RAM (PRAM), a flash memory device, etc.

Figure 10:
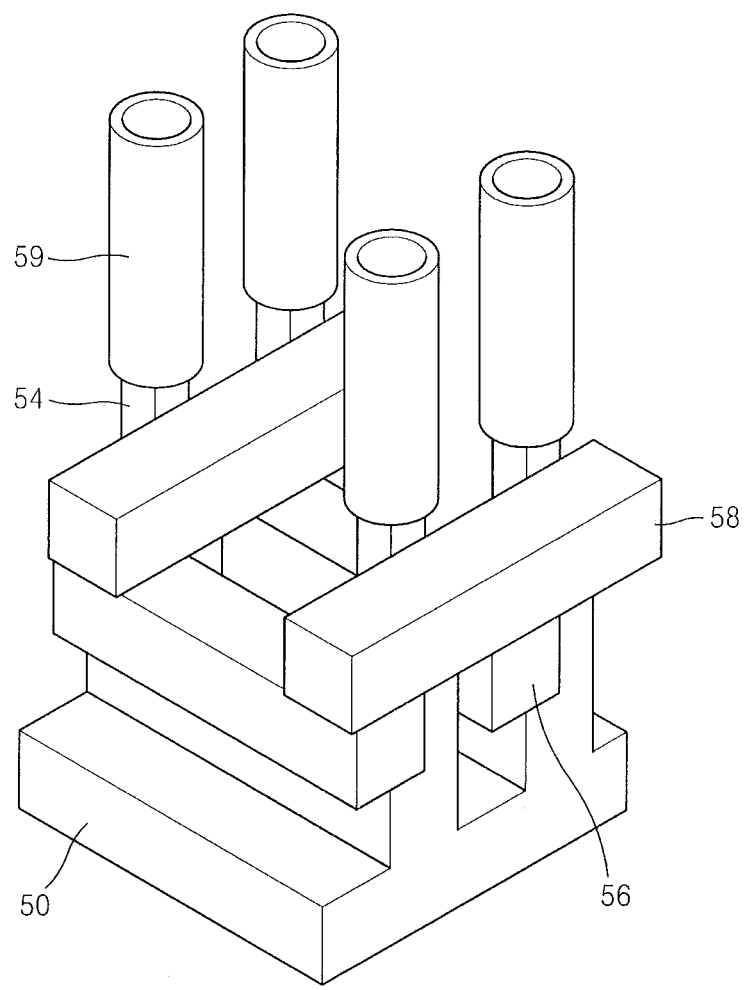
FIG. 10 is a perspective view illustrating a memory device according to an embodiment of the inventive concept.

FIG. 10 is a perspective view illustrating a memory device according to an embodiment of the inventive concept. The memory device of FIG. 10 may employ the semiconductor device of FIGS. 1 through 3, and thus a description thereof will be omitted below for brevity.

Referring to FIG. 10, a plurality of storage electrodes 59 are provided. Each of the storage electrodes 59 may be disposed on a semiconductor pillar 54. The storage electrodes 59 may be electrically connected to the respective upper impurity regions 53 (see FIG. 2), and may be used as lower electrodes of a capacitor structure. Accordingly, the memory device of FIG. 10 may be used in a DRAM device.

Figure 11:
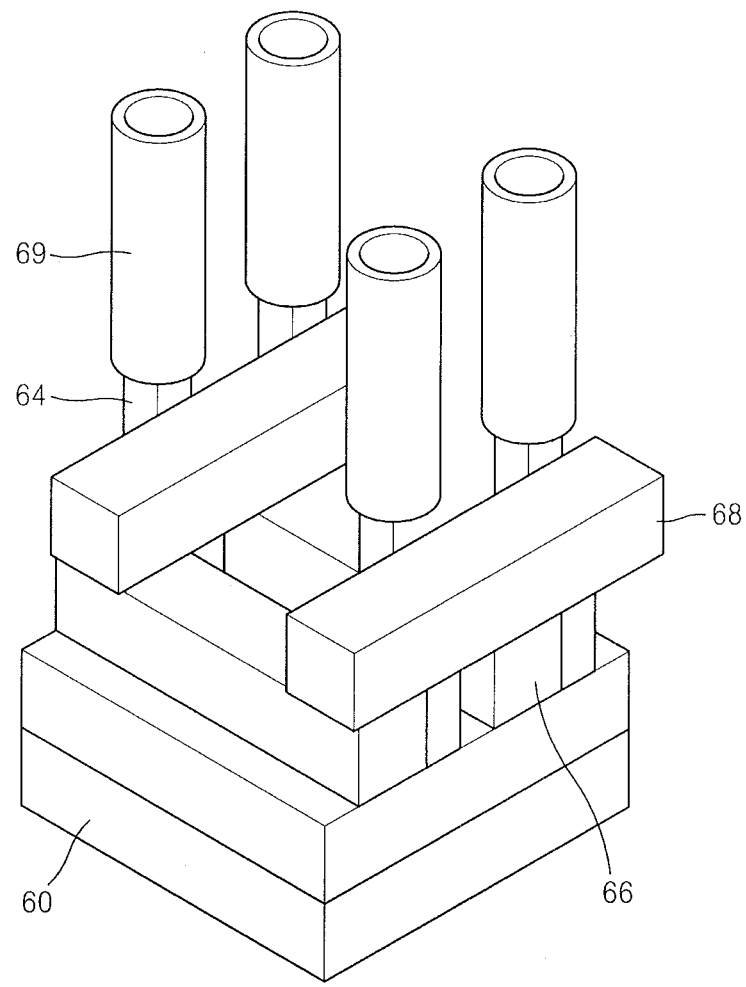
FIG. 11 is a perspective view illustrating a memory device according to another embodiment of the inventive concept.

FIG. 11 is a perspective view illustrating a memory device according to another embodiment of the inventive concept. The memory device of FIG. 11 may employ the semiconductor device of FIGS. 4 through 6, and thus a description thereof will be omitted below.

Referring to FIG. 11, a plurality of storage electrodes 69 are provided. Each of the storage electrodes 69 may be disposed on a semiconductor pillar 64. The storage electrodes 69 may be electrically connected to the respective upper impurity regions 63 (see FIG. 5) and may be used as lower electrodes of a capacitor structure. Accordingly, the memory device of FIG. 11 may be used in a DRAM device.

Figure 12:
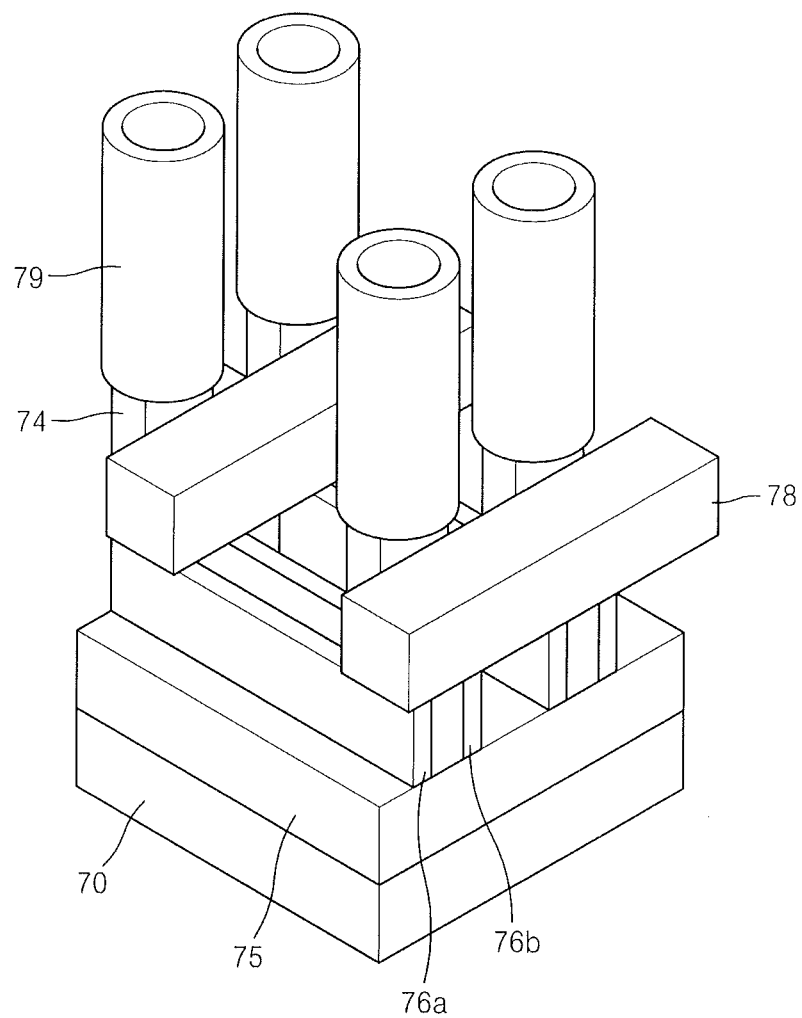
FIG. 12 is a perspective view illustrating a memory device according to another embodiment of the inventive concept.
Figure 13A:
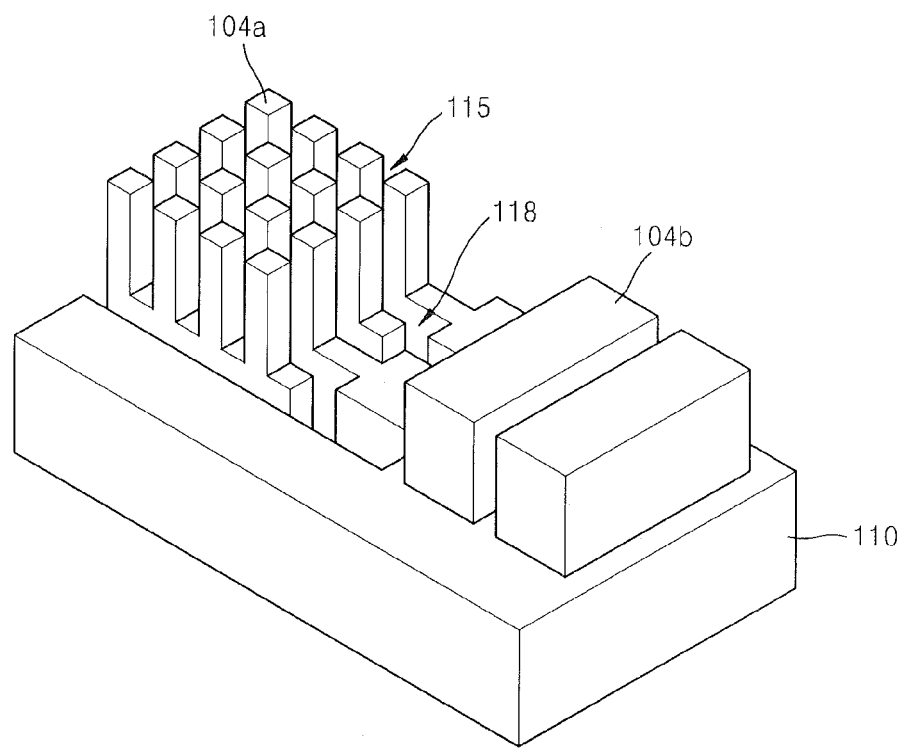
FIGS. 13A through 22E are views illustrating a method of manufacturing a semiconductor device and a memory device, according to an embodiment of the inventive concept.
Figure 13B:
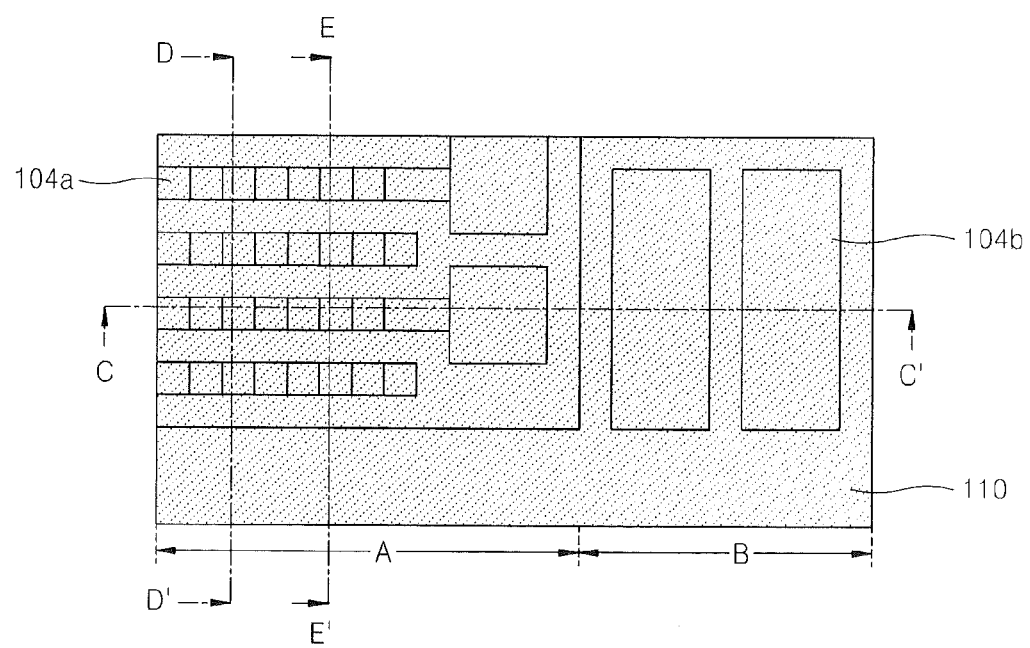
Figure 13C:
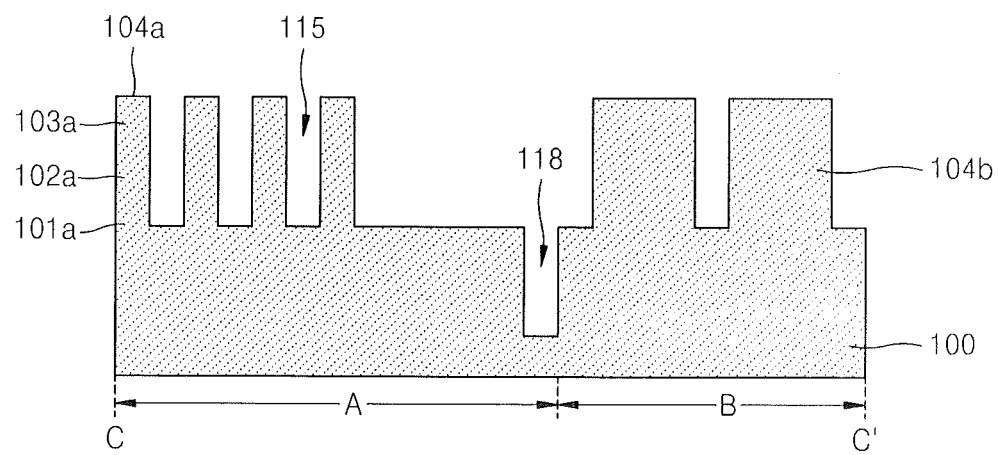
Figure 13D:
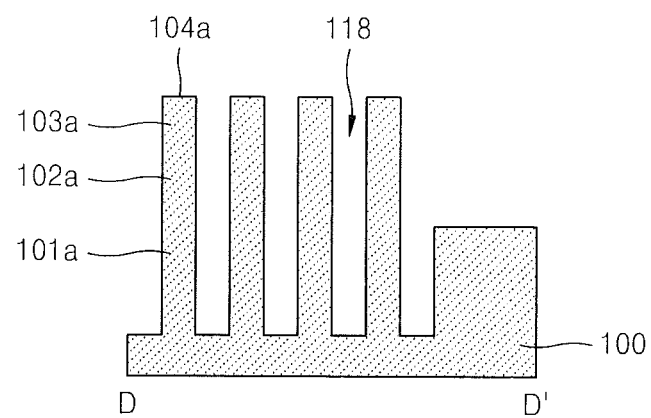
Figure 13E:
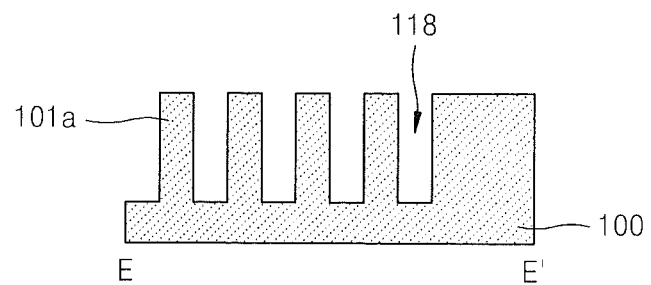

FIG. 12 is a perspective view illustrating a memory device according to another embodiment of the inventive concept. The memory device of FIG. 12 may use the semiconductor device of FIGS. 7 through 9, and thus a description thereof will be omitted below.

Referring to FIG. 12, a plurality of storage electrodes 79 are provided. Each of the storage electrodes 79 may be disposed on the semiconductor pillar 74. The storage electrodes 79 may be electrically connected to the respective upper impurity regions 73 (see FIG. 8) and may be used as lower electrodes of a capacitor structure. Accordingly, the memory device of FIG. 12 may be used in a DRAM device.

Figure 22B:
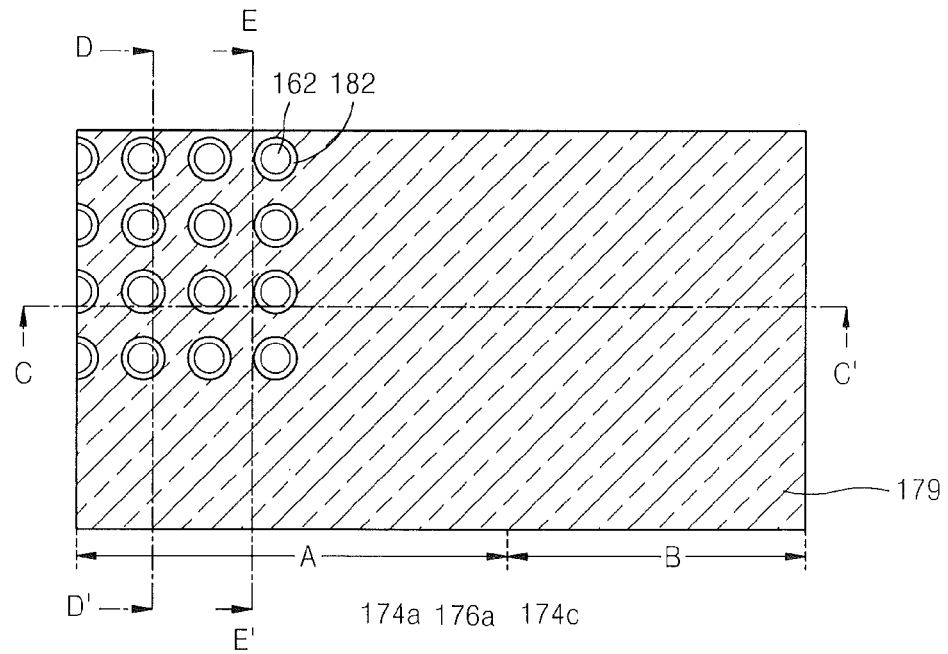
Figure 22C:
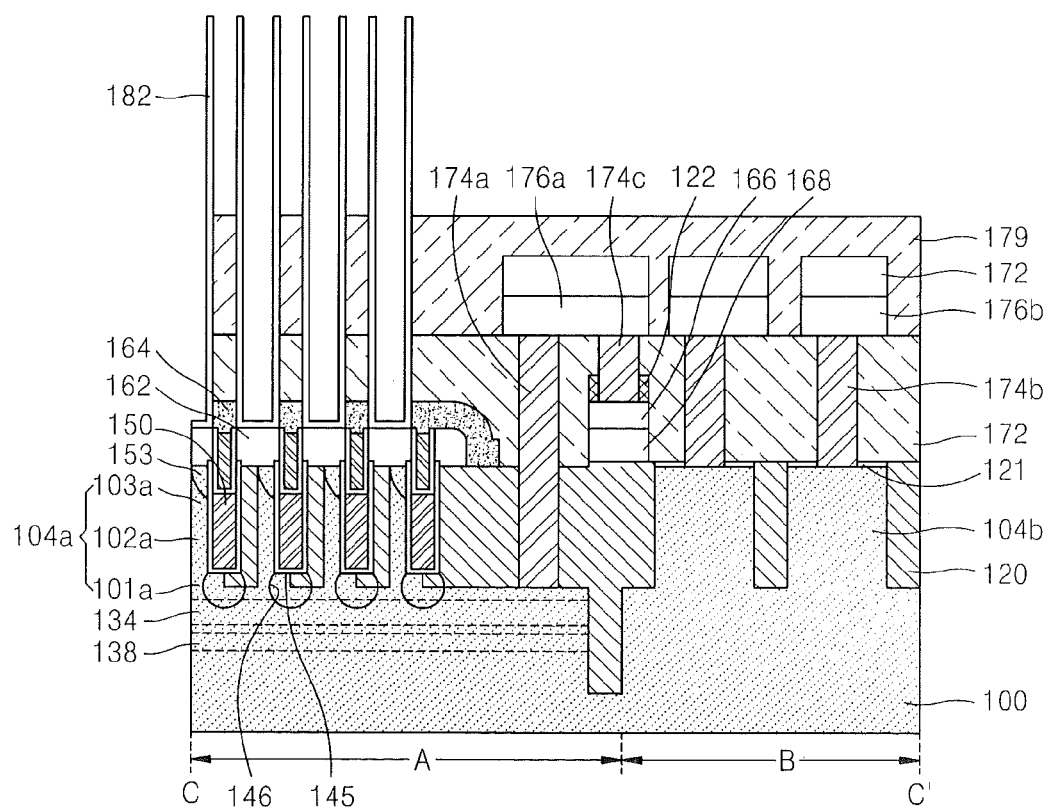
Figure 22D:
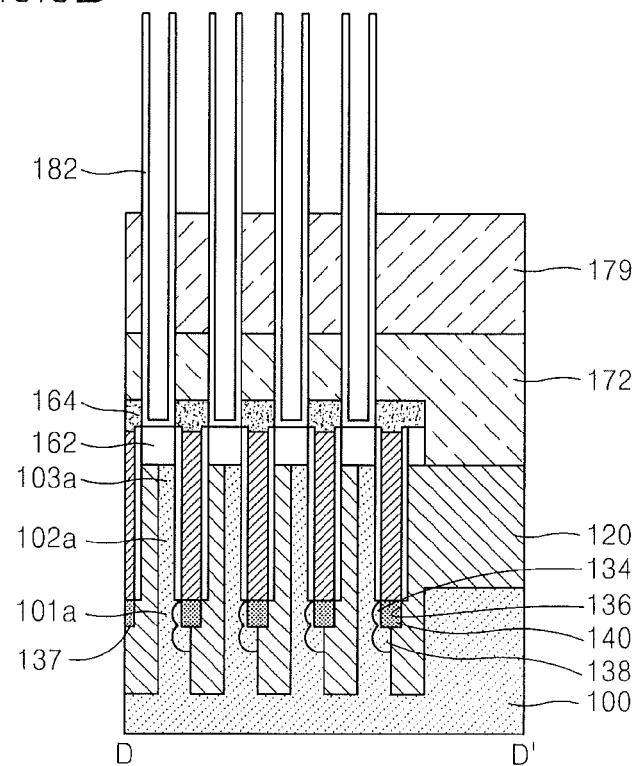
Figure 22E:
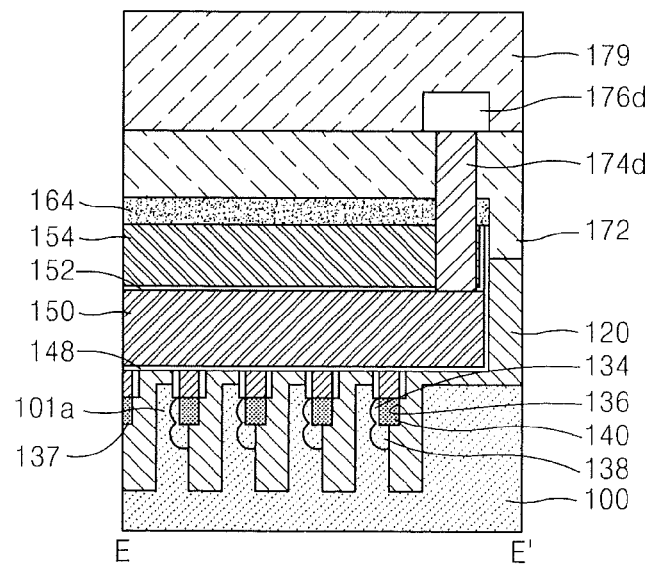

FIGS. 13A through 22E are views illustrating a method of manufacturing a semiconductor device and a memory device, according to embodiments of the inventive concept. FIGS. 13A through 17A are perspective views illustrating the semiconductor device and the method of manufacturing the semiconductor device. FIGS. 13B through 22B are plan views illustrating the semiconductor device and the method of manufacturing the semiconductor device. FIGS. 13C and 22C are cross-sectional views taken along a line C-C' of the plan views of the semiconductor device of FIGS. 13B through 22B, respectively. FIGS. 13D and 22D are cross-sectional views taken along a line D-D' of the plan views of the semiconductor device of FIGS. 13B through 22B, respectively. FIGS. 13E and 22E are cross-sectional views taken along a line E-E' of the plan views of the semiconductor device of FIGS. 13B through 22B, respectively.

Referring to FIGS. 13A through 13E, a substrate 110 may include a cell region A and a peripheral circuit region B. For example, a vertical type semiconductor device may be formed on the cell region A, and a planar type semiconductor device may be formed on the peripheral circuit region B. However, according to other embodiments of the inventive concept, the vertical type semiconductor device may be formed on both the cell region A and the peripheral circuit region B. The substrate 110 may include a semiconductor material, for example, a Group IV semiconductor, a Group III-V compound semiconductor and/or a Group oxide semiconductor II-VI. The Group IV semiconductor may be silicon, germanium, or silicon-germanium.

First and second trenches 115 and 118 may be formed in the cell region A by etching the substrate 110 so as to define a plurality of semiconductor pillars 104a. For example, the first trenches 115 may be formed, and then the second trenches 118 may be formed from a surface of the substrate 110. According to another embodiment of the inventive concept, after the second trenches 118 are formed, the first trenches 115 may be formed. In this case, the second trenches 118 may have a depth greater than those of the first trenches 115. That is, the substrate 110 may have a two-step trench structure. The semiconductor pillars 104a may be arranged in a matrix array due to the first and second trenches 115 and 118.

According to another embodiment of the inventive concept, after the first trenches 115 are formed, the second trenches 118 may be formed through the first trenches 115.

Each of the semiconductor pillars 104a may include a lower impurity region 101a, a vertical channel region 102a, and an upper impurity region 103a. The lower impurity regions 101a may be connected to one another along a direction of the line C-C'. For example, the second trenches 118 may extend along the line C-C' so that the lower impurity regions 101a may be connected to one another along a direction of the line C-C'.

The peripheral circuit region B may include a plurality of substantially planar active regions 104b. For example, the first trenches 115 may be formed in the peripheral circuit region B by etching the substrate 110, thereby forming the planar active regions 104b. Then, planar type transistors may be formed on the planar active regions 104b.

Figure 14A:
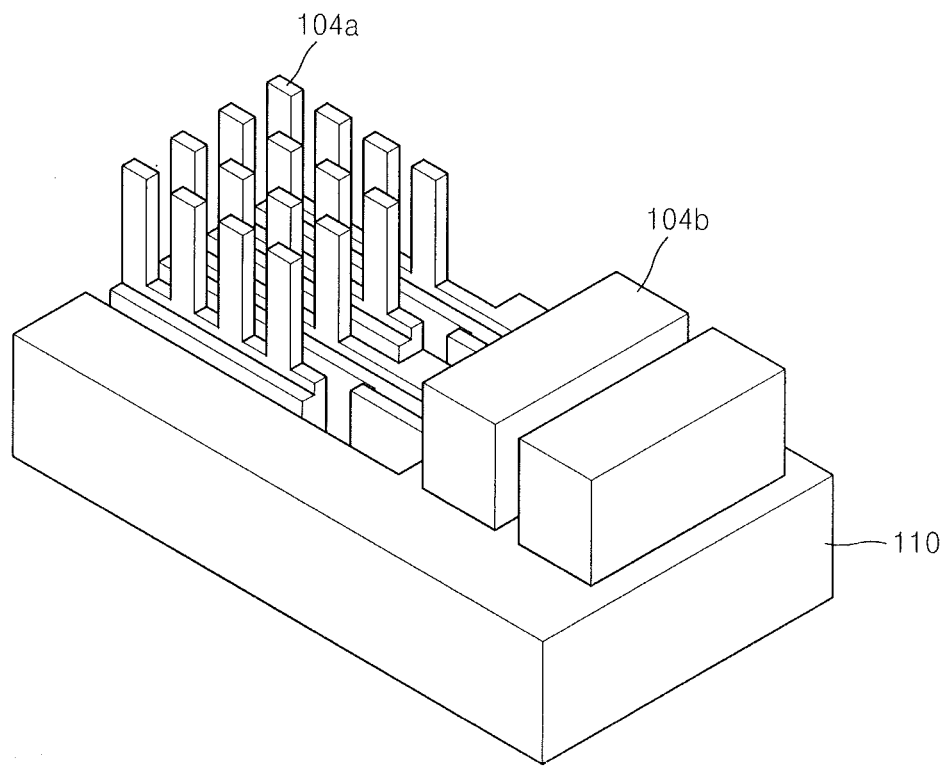
Figure 14B:
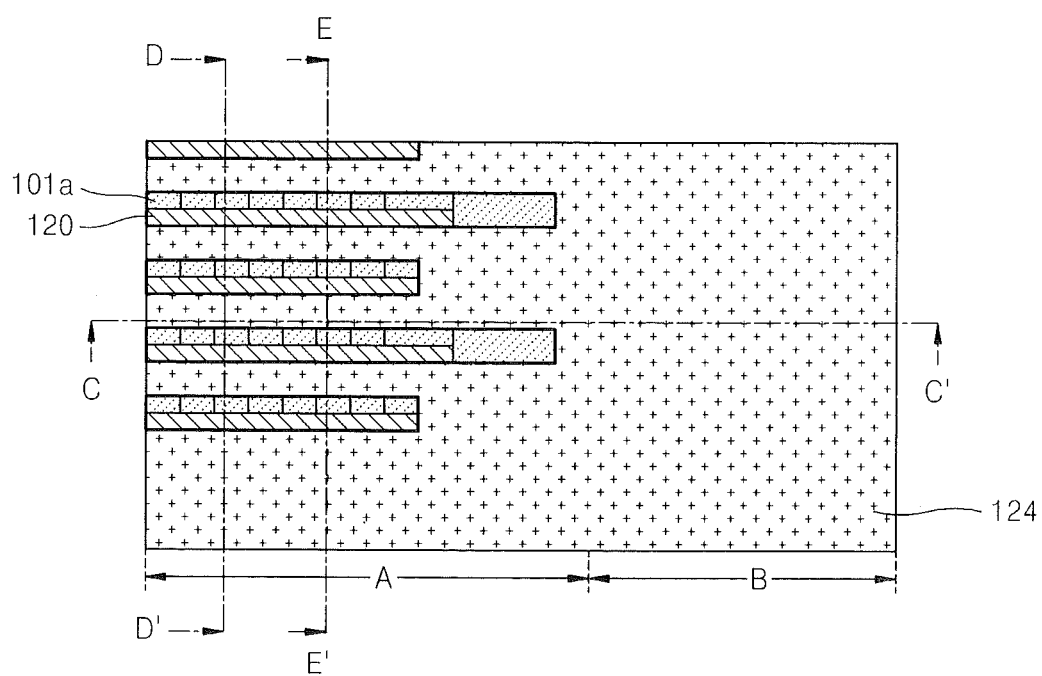
Figure 14C:
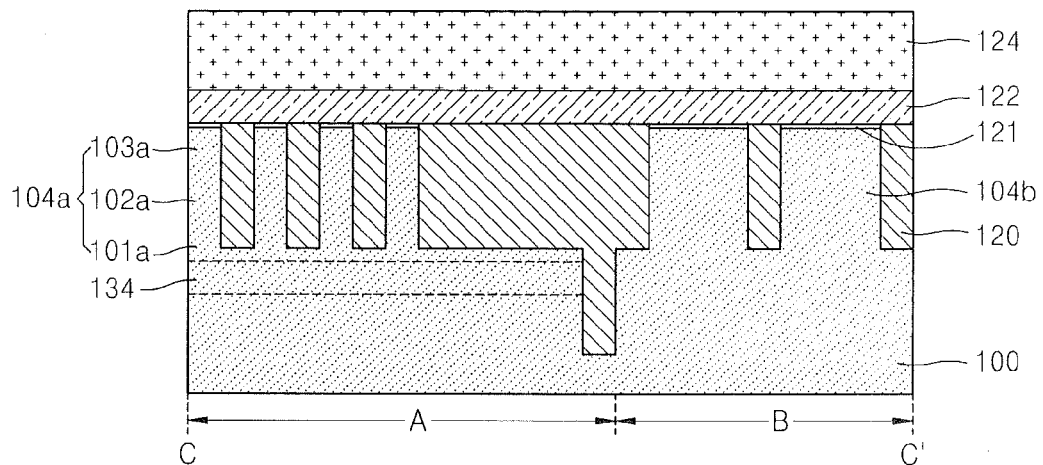
Figure 14D:
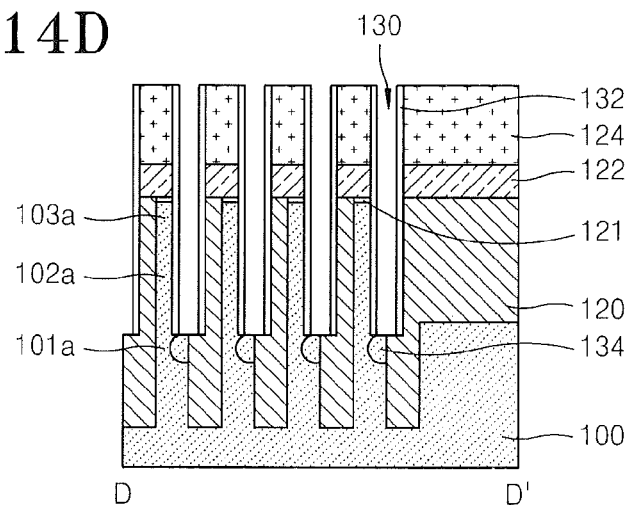
Figure 14E:
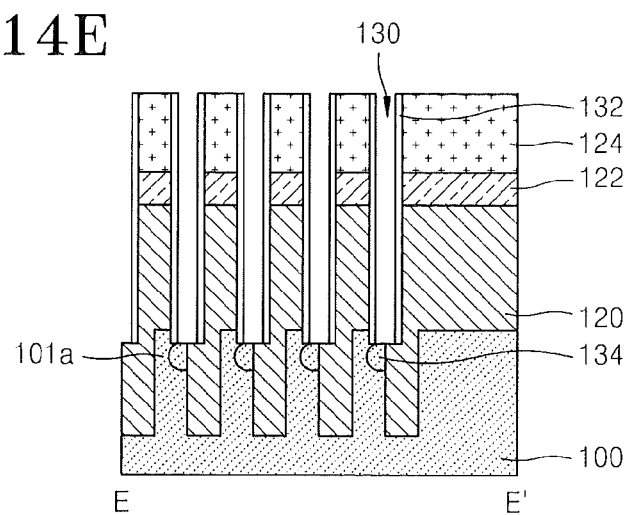
Figure 15A:
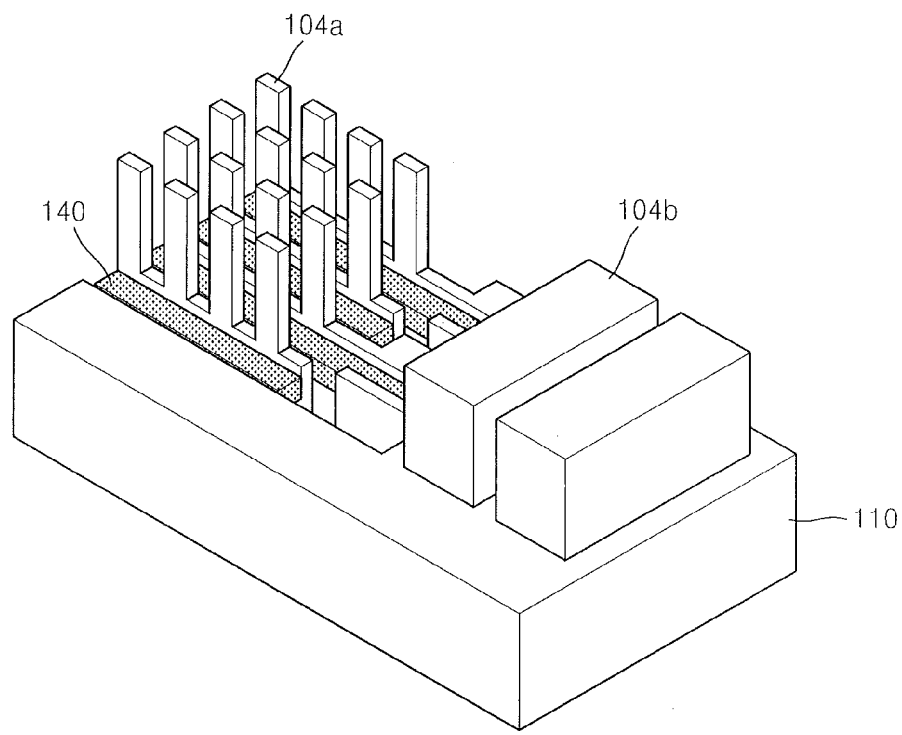
Figure 15B:
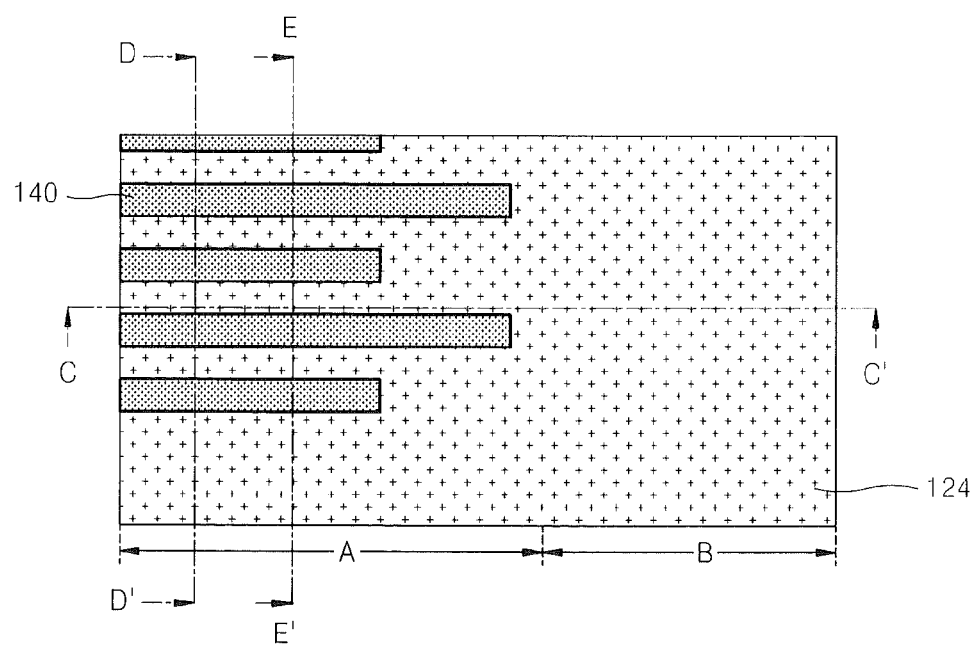
Figure 15C:
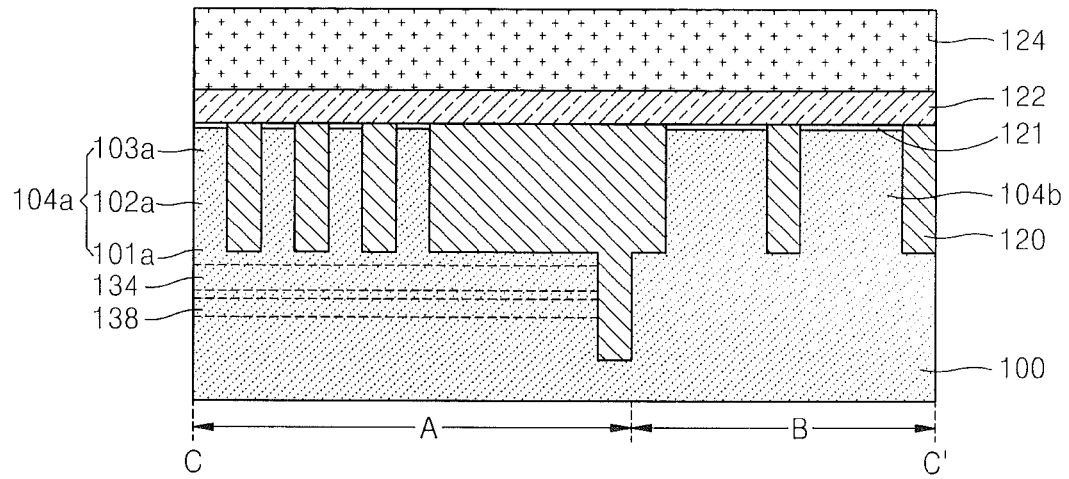
Figure 15D:
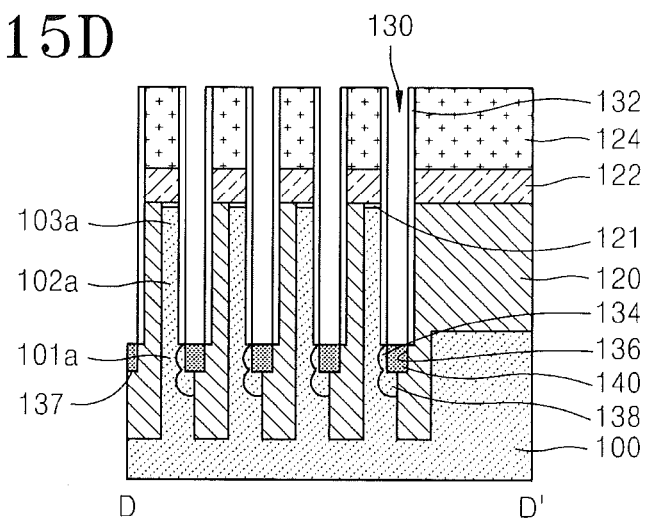
Figure 15E:
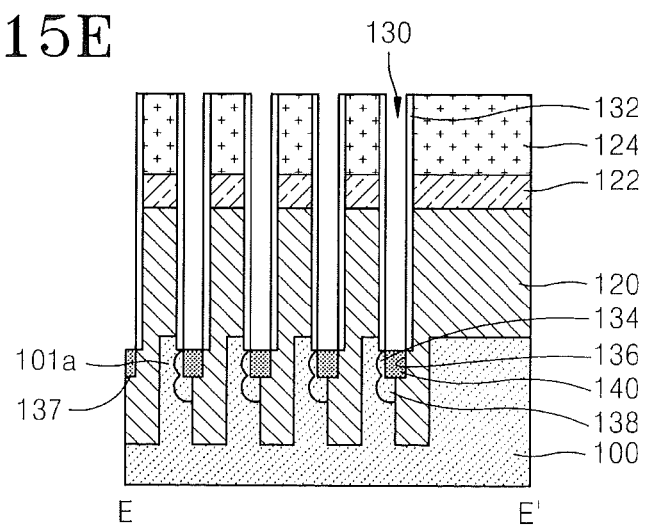
Figure 16A:
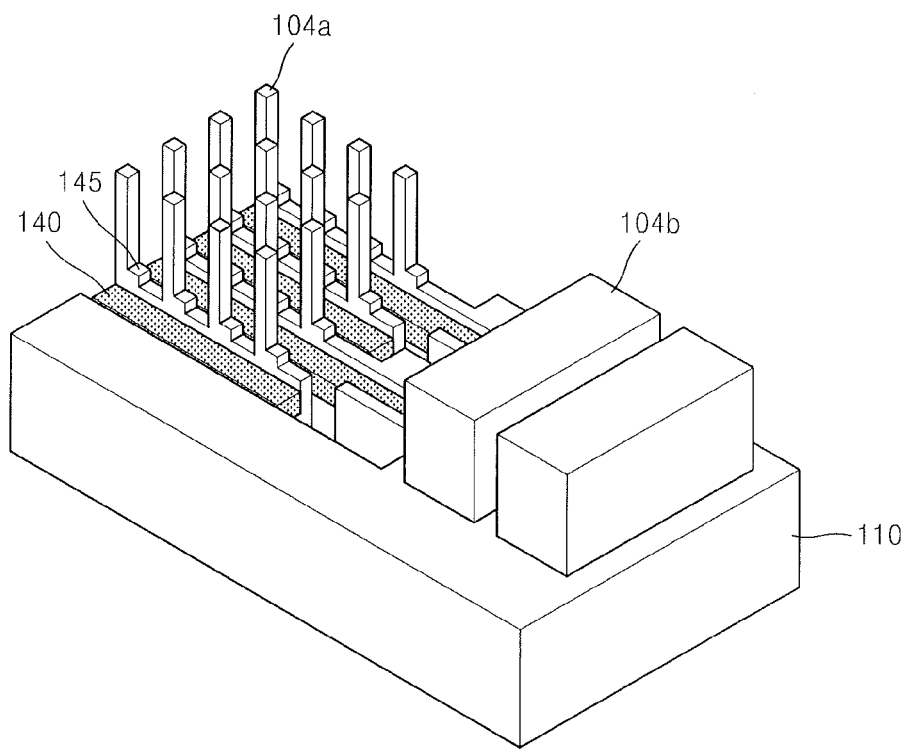
Figure 16B:
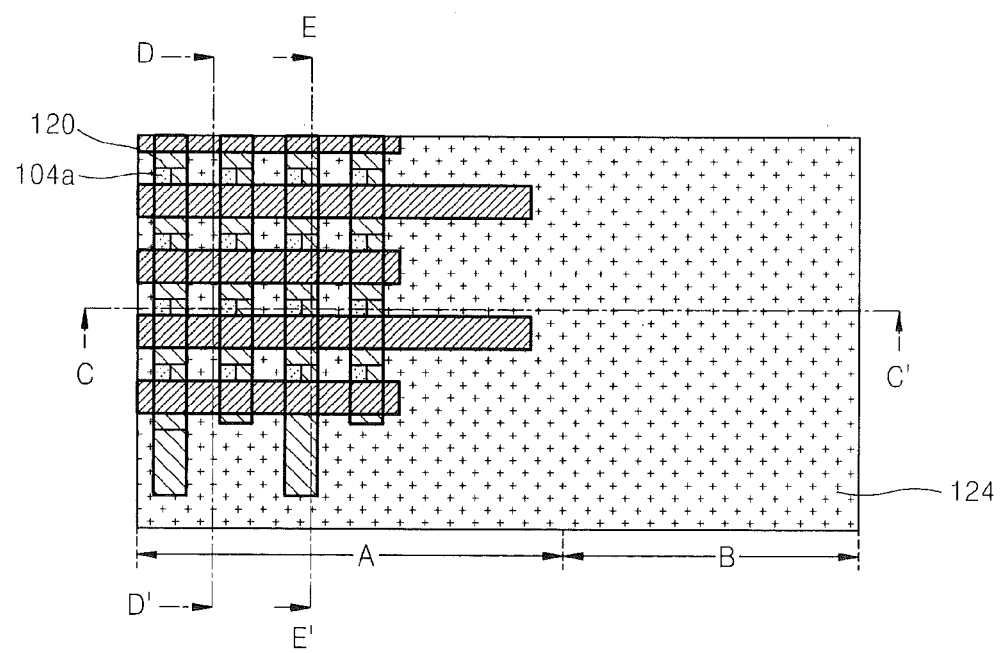

Referring to FIGS. 14A through 14E, a device isolation insulating layers 120 for filling the first and second trenches 115 and 118 may be formed. In FIG. 14A, for convenience of illustration, the device isolation insulating layers 120 are omitted. For example, a plurality of insulating layers (not shown) are formed to fill the first and second trenches 115 and 118, and then the insulating layers are planarized, thereby forming the device isolation insulating layers 120. In some embodiments, before the insulating layers are formed, a plurality of buffer insulating layers and/or a plurality of liner insulating layers may further be formed.

A gate insulating layer 121 may be formed on surfaces of the semiconductor pillars 104a and the planar active region 104b that are exposed by the device isolation insulating layers 120. For example, the gate insulating layers 121 may be formed by performing selective thermal-oxidation on the surfaces of the semiconductor pillars 104a and the planar active region 104b. According to another embodiment of the inventive concept, the gate insulating layers 121 may be formed by depositing appropriate insulating layers on the exposed surfaces of the semiconductor pillars 104a and the planar active region 104b.

A plurality of gate electrode layers 122 and a plurality of hard mask layers 124 may be sequentially formed on the gate insulating layers 121 and the device isolation insulating layers 120 in the order stated. For example, the gate electrode layer 122 may include an appropriate conductive layer, for example, polysilicon and/or a metal. The hard mask layer 124 may include a material having an etching selectivity with respect to the device isolation insulating layer 120. For example, when the device isolation insulating layer 120 includes silicon nitride, the hard mask layer 124 may include silicon nitride or oxide.

A plurality of third trenches 130 may be formed by etching the semiconductor pillars 104a of the cell region A along the line C-C'. For example, the third trenches 130 may be formed by etching the hard mask layers 124, the gate electrode layers 122, the gate insulating layers 121, and the device isolation insulating layers 120 of the cell region A to a predetermined depth.

For example, the third trenches 130 may have a predetermined depth by etching the semiconductor pillars 104a by a half depth thereof along the line C-C". The depth of the third trench 130 is greater than that of the first trench 115, and thus the third trench 130 penetrates into the lower impurity region 101a of the semiconductor pillars 104a. A plurality of spacer insulating layers 132 may be formed on side walls of the semiconductor pillars 104a. For example, the spacer insulating layer 132 may be silicon nitride.

A plurality of first lower doping regions 134 may be formed by implanting or injecting a first conductive impurity (e.g., impurities of a first conductive type) into the lower impurity region 101a through the third trench 130. For example, when a vertical type semiconductor device is an N-channel semiconductor device, the first conductive impurity may be an N+ impurity, for example, arsenic (As) or phosphorus (P).

Referring to FIGS. 15A through 15E, a plurality of fourth trenches 136 may be formed by etching the lower impurity region 101a from the third trench 130 to a predetermined depth. For example, the depth of the fourth trench 136 may be less than or the same as that of the first lower doping region 134. A first mesa part 137 may be formed in the lower impurity region 101a as defined by the fourth trench 136.

A plurality of second lower doping regions 138 each may be formed by implanting or injecting the first conductive impurity into the lower impurity region 101a through the fourth trench 136. The second lower doping regions 138 may be connected to the first lower doping regions 134.

A bit line 140 may be formed inside each of the fourth trenches 136. For example, the bit line 140 may be formed by embedding an appropriate conductive layer in the fourth trench 136. According to another embodiment of the inventive concept, the bit line 140 may be formed by metal-siliciding the portions of the lower impurity region 101a exposed by the fourth trench 136. The bit line 140 may include a metal or a metal silicide.

The bit line 140 may directly contact the lower impurity region 101a on the first mesa part 137, and particularly, may directly contact the first and second lower doping regions 134 and 138. For example, a part of the bit line 140 contacting the lower impurity region 101a may be surrounded by the first and second lower doping regions 134 and 138, thereby reducing the contact resistance between the bit line 140 and the lower impurity region 101a.

Referring to FIGS. 16A through 16E, a buried insulating layer 142 for filling the third trenches 130 may be formed. Optionally, before the buried insulating layer 142 is formed, a liner insulating layer may further be formed on the bit lines 140. For example, the buried insulating layer 142 may be silicon oxide, and the liner insulating layer may be silicon nitride.

A plurality of fifth trenches 144 may be formed by etching the semiconductor pillars 104a along a line E-E'. For example, the fifth trenches 144 and the third and fourth trenches 130 and 136 may substantially cross each other at right angles, and a half of the width of the semiconductor pillar 104a may be recessed along the line E-E'. The fifth trench 144 may be formed to be thinner than the third trench 130, and may contact the lower impurity region 101a.

Thus, the width of the upper impurity region 103a and the vertical channel region 102a may be only a quarter of that of the semiconductor pillar 104a due to the formation of the third and fifth trenches 130 and 144. A second mesa part 145 may be defined on the lower impurity region 101a by the fifth trench 144. The second mesa part 145 may be formed on a side wall different from the side wall on which the first mesa part 137 is formed.

Next, a plurality of third lower doping regions 146 may be formed by implanting or injecting the first conductive impurity through the fifth trenches 144. The first through third lower doping regions 134, 138, and 146 together may substantially form first source/drain regions. Accordingly, the bit lines 140 may be connected to the first through third lower doping regions 134, 138, and 146, that is, to the respective first source/drain regions. According to the current embodiment, the first source/drain regions may be formed self-aligned through the fifth trenches 144, without performing an additional photolithography process.

Figure 17A:
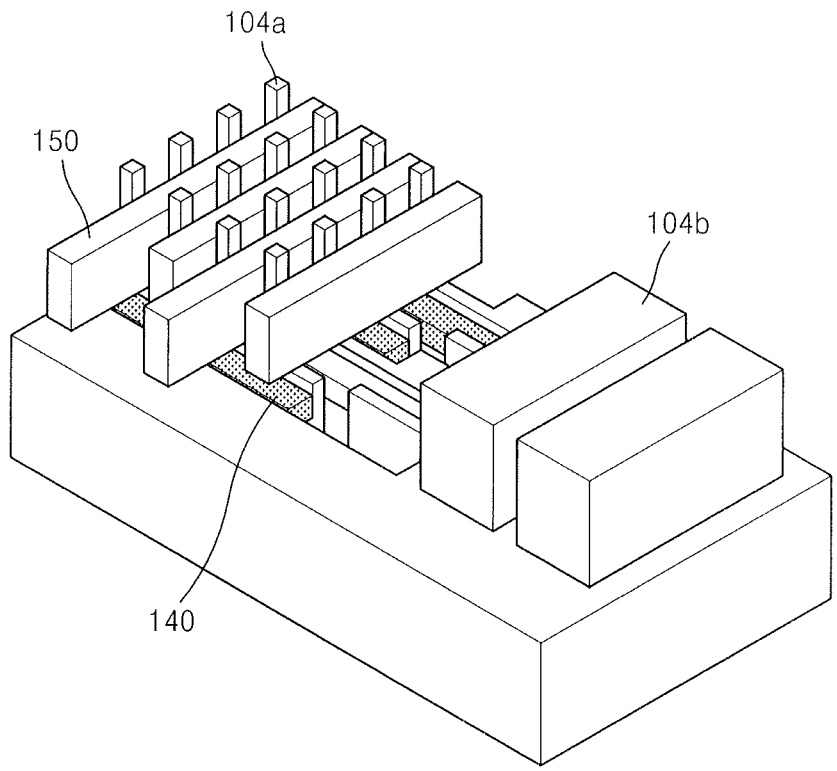
Figure 17B:
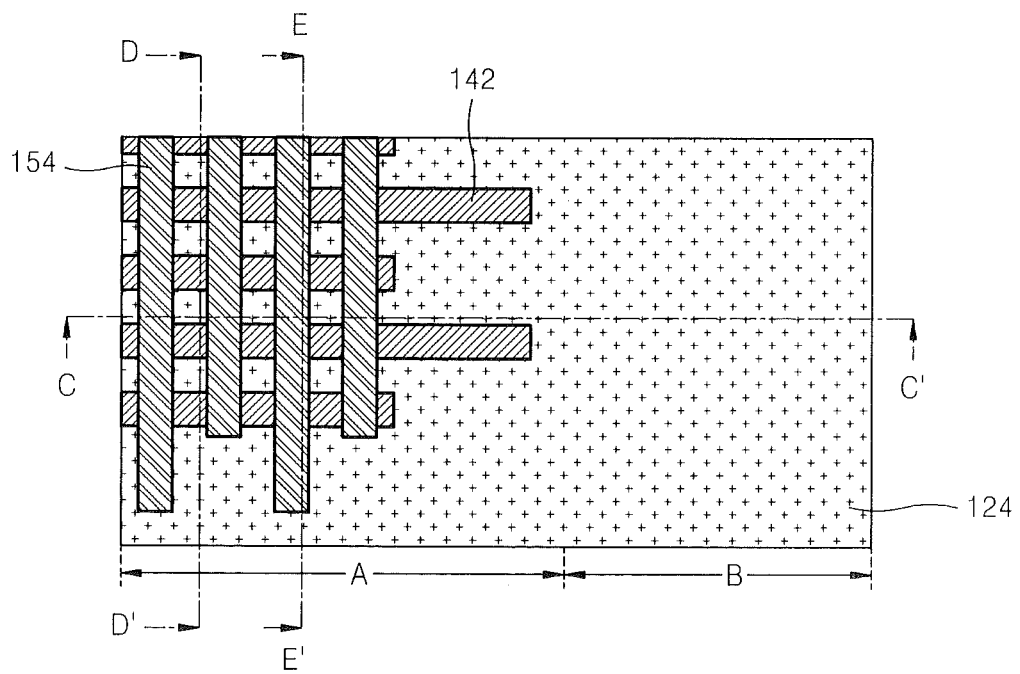
Figure 17C:
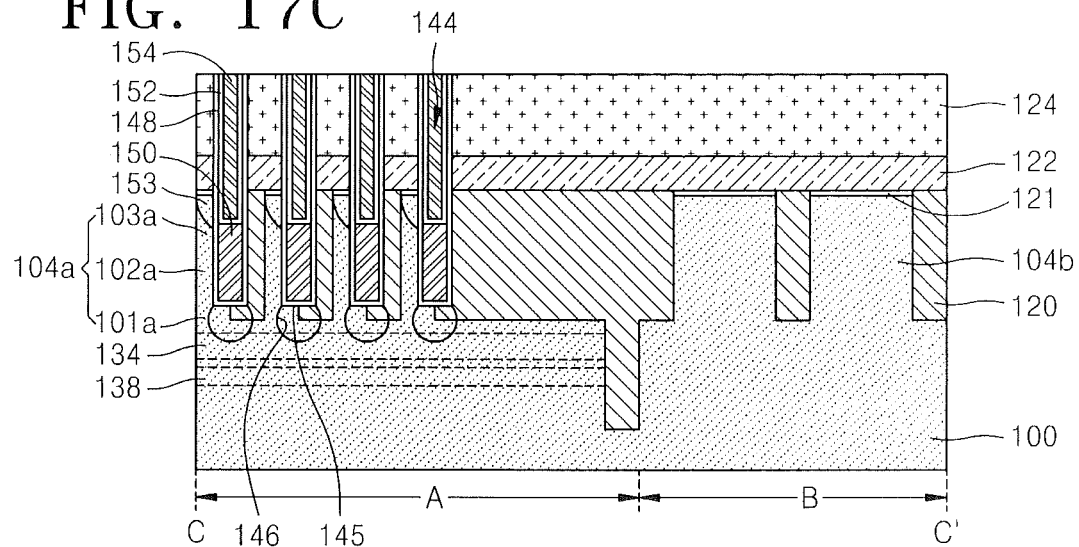
Figure 17D:
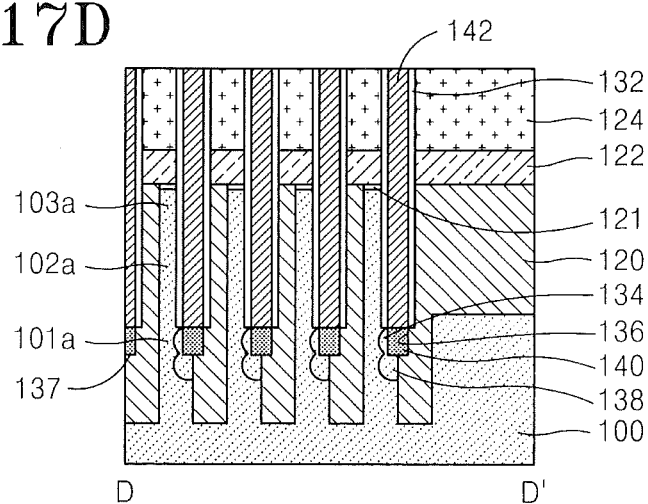
Figure 17E:
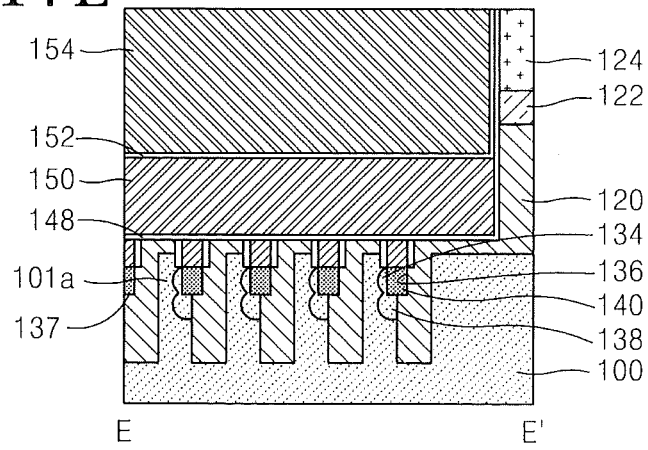

Referring to FIGS. 17A through 17C, a second gate insulating layer 148 may be formed on surfaces of the semiconductor pillars 104a exposed by the fifth trenches 144. Then, word lines 150 may be formed on the second gate insulating layer 148 so as to be embedded in each of the fifth trenches 144 by a predetermined depth. The second gate insulating layer 148 may be substantially formed on the vertical channel regions 102a.

For example, the word lines 150 may be formed by filling an appropriate conductive layer in the fifth trenches 144 by a predetermined depth, or by filling an appropriate conductive layer and then performing an etchback process on the conductive layer. The word lines 150 may be substantially formed on the respective vertical channel regions 102a.

An upper doping region 153 may be formed by implanting or injecting a first conductive impurity into the upper impurity regions 103a exposed by the fifth trenches 144. The upper doping region 153 may substantially form second source/drain regions. The second source/drain regions may be formed self-aligned through the fifth trenches 144, without performing an additional photolithography process.

A liner insulating layer 152 may be formed inside the fifth trenches 144, and a second buried insulating layer 154 may be formed in the fifth trenches 144. The second buried insulating layer 154 and the liner insulating layer 152 may include materials having an etching selectivity with respect to each other. For example, the second buried insulating layer 154 may be silicon oxide, and the liner insulating layer 152 may be silicon nitride. The second buried insulating layer 154 may be formed by depositing an insulating layer and planarizing the insulating layer.

Figure 18B:
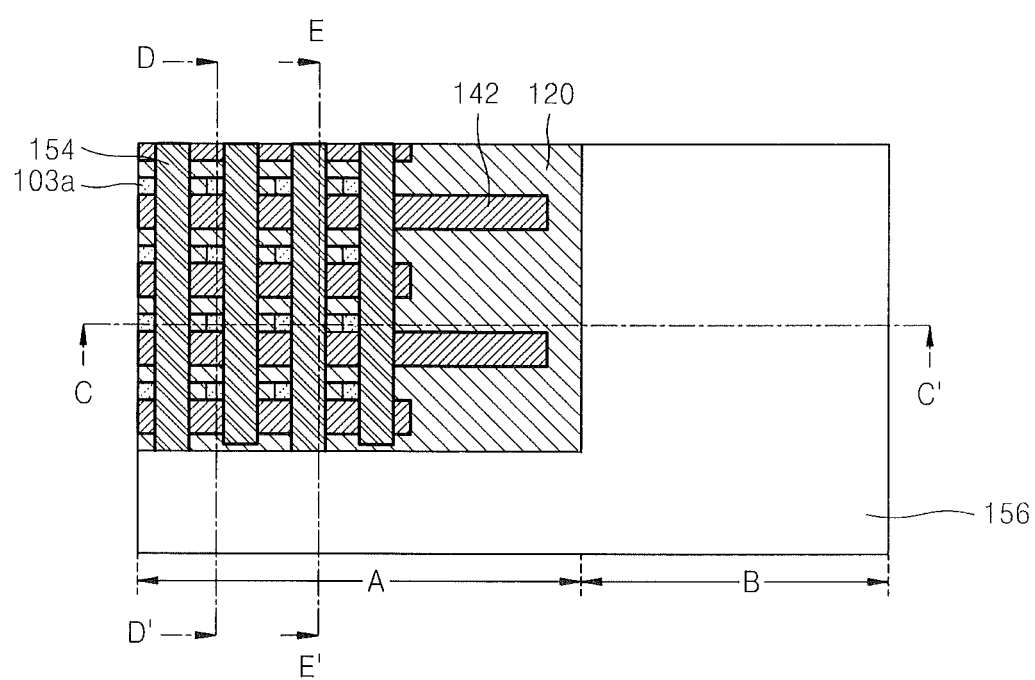
Figure 18C:
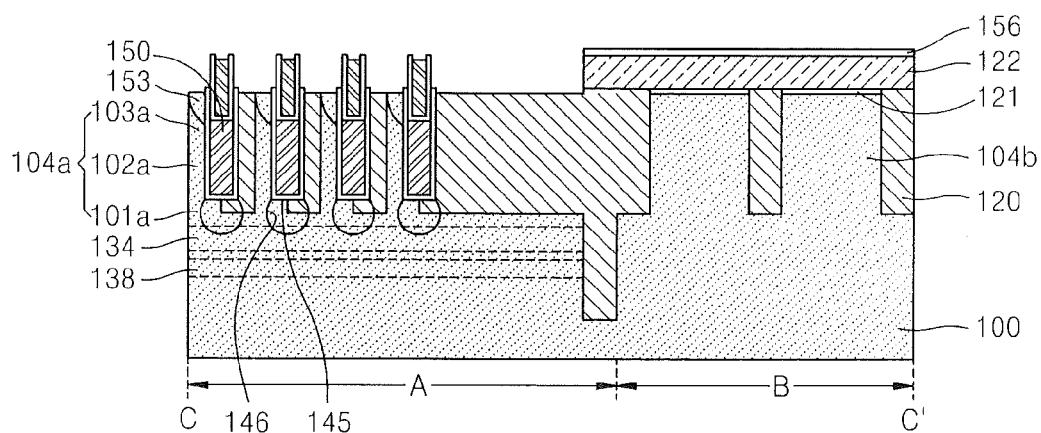
Figure 18D:
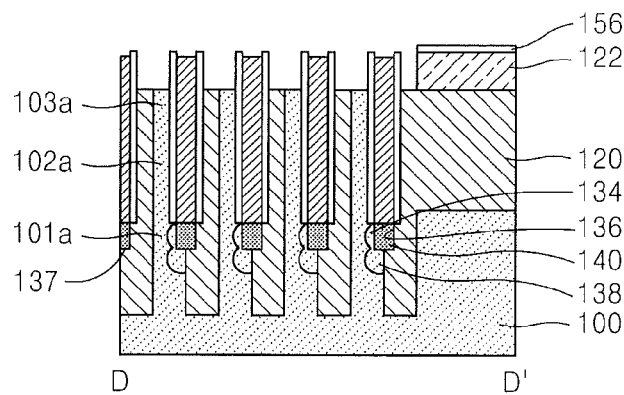
Figure 18E:
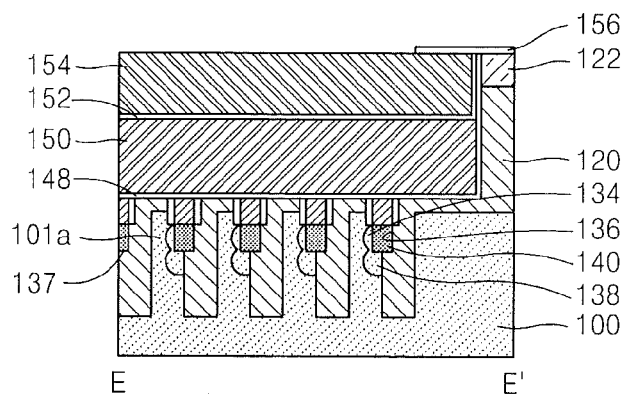
Figure 19B:
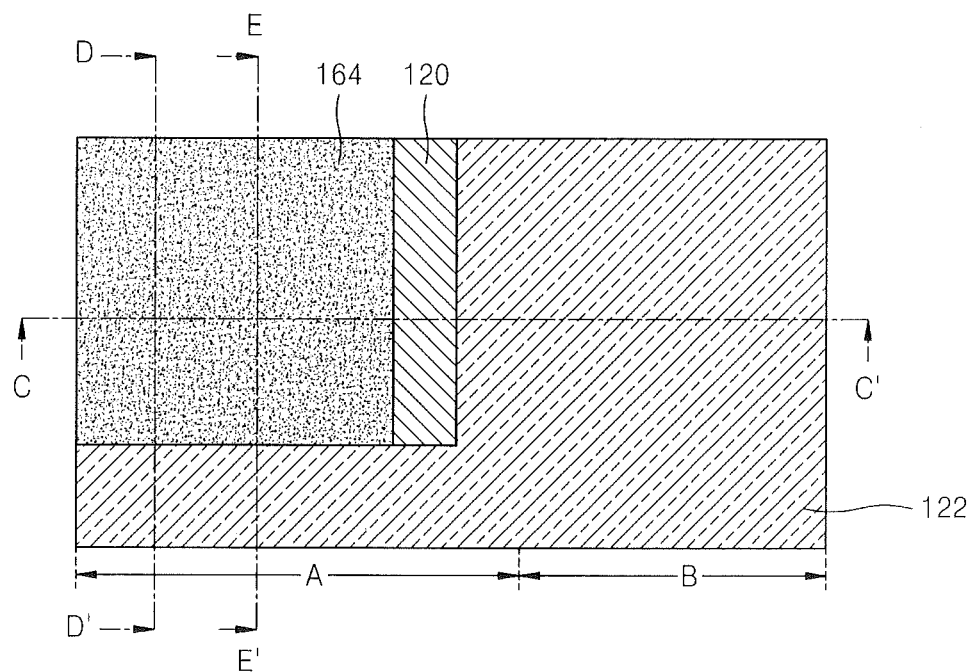
Figure 19C:
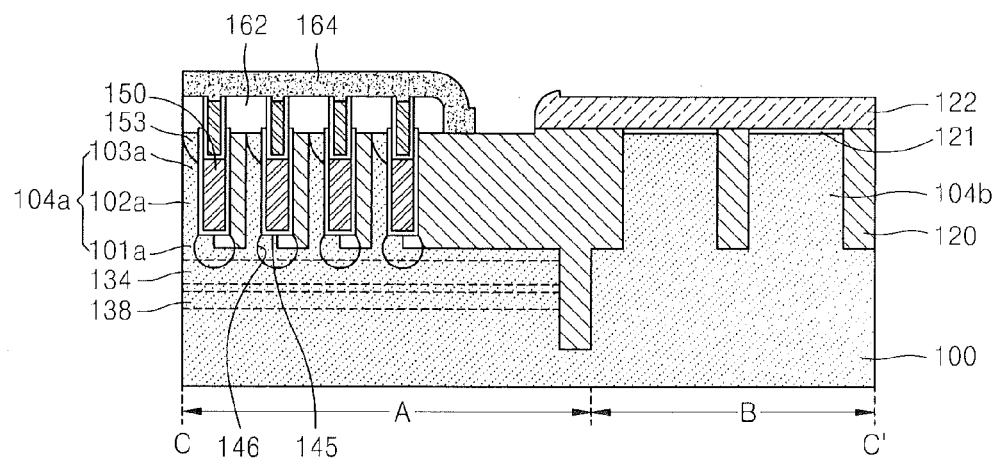
Figure 19D:
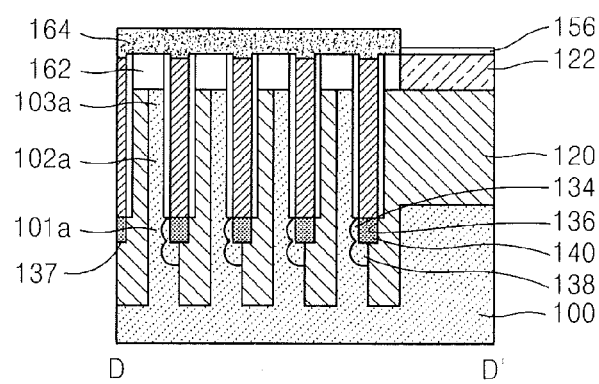
Figure 19E:
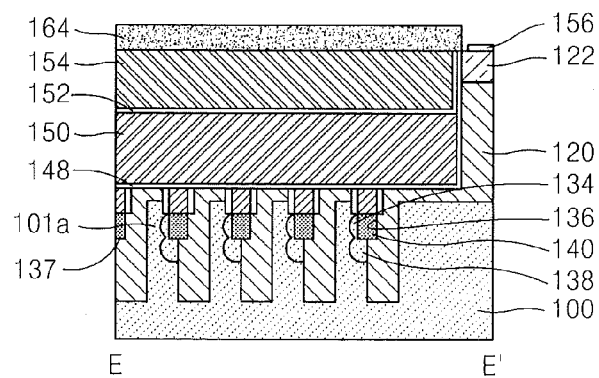
Figure 20B:
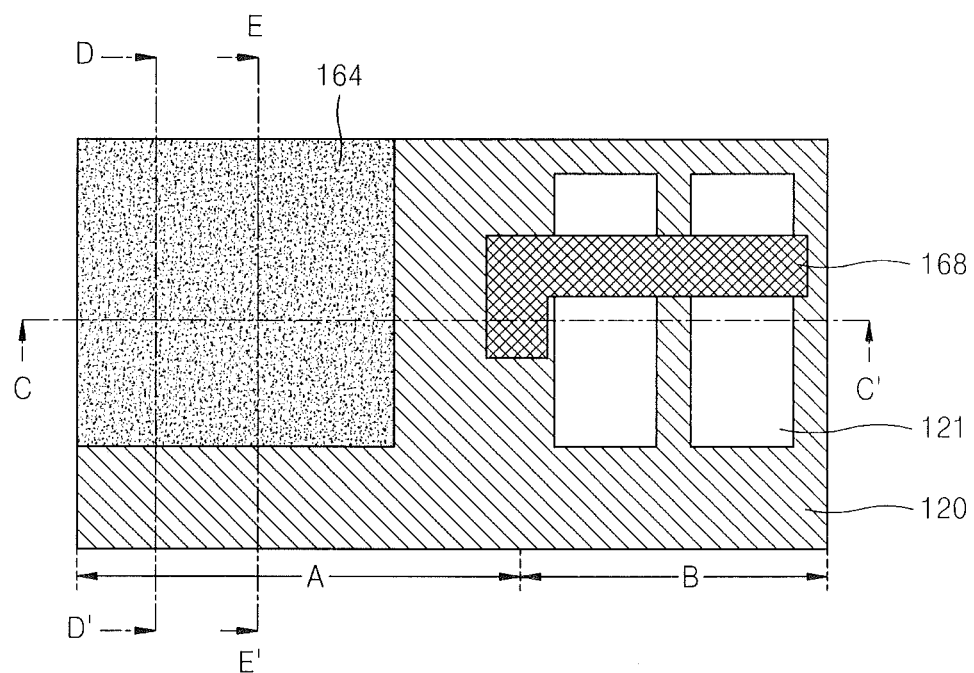
Figure 20C:
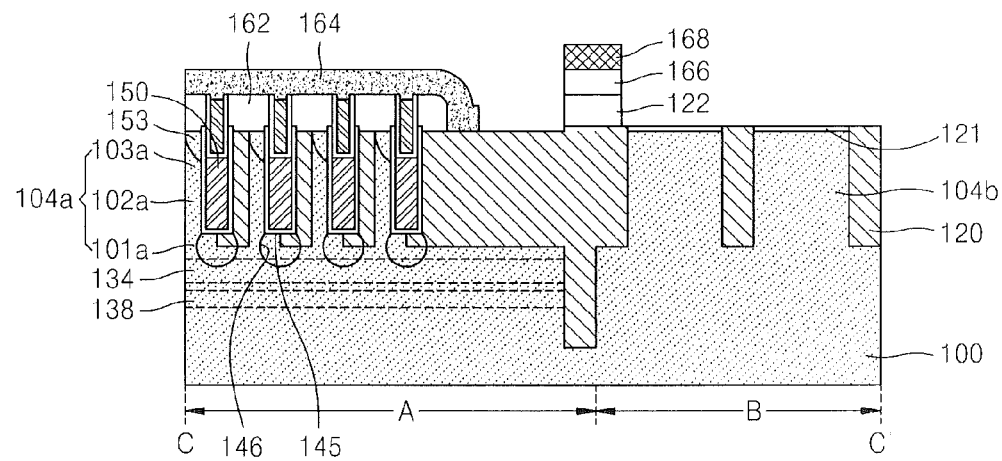
Figure 20D:
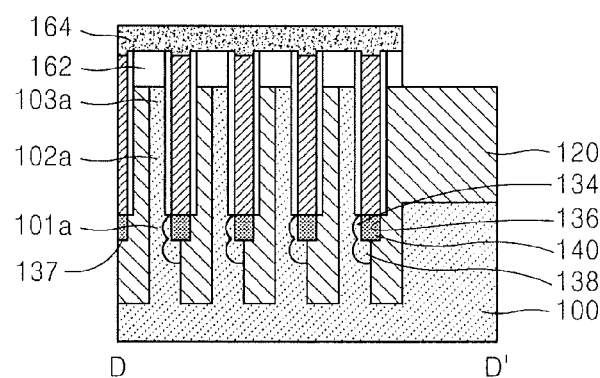
Figure 20E:
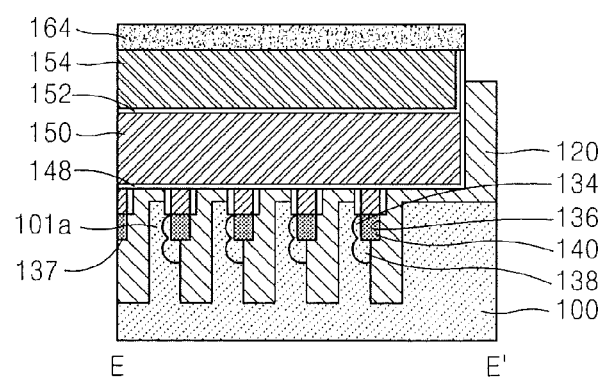
Figure 21B:
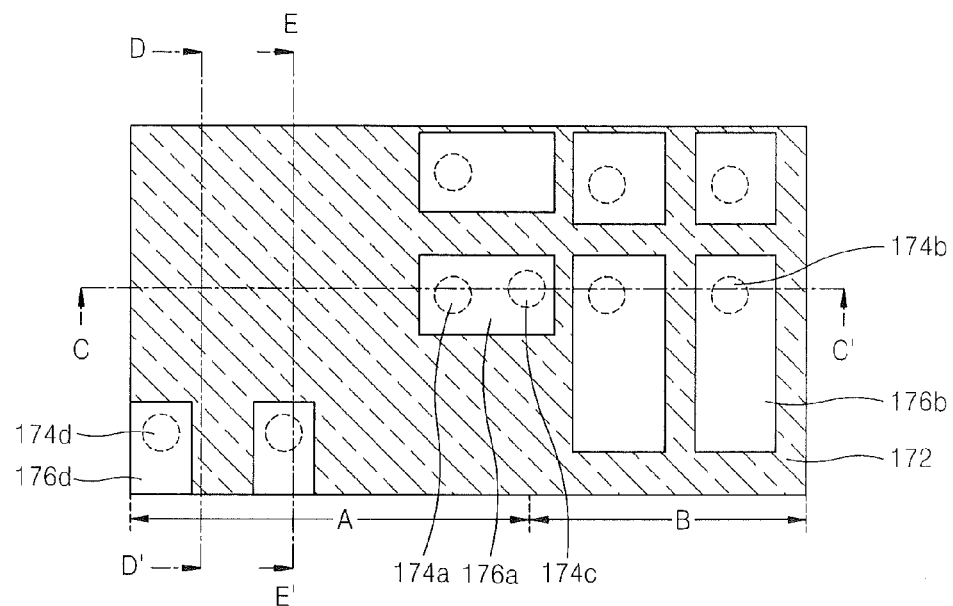
Figure 21C:
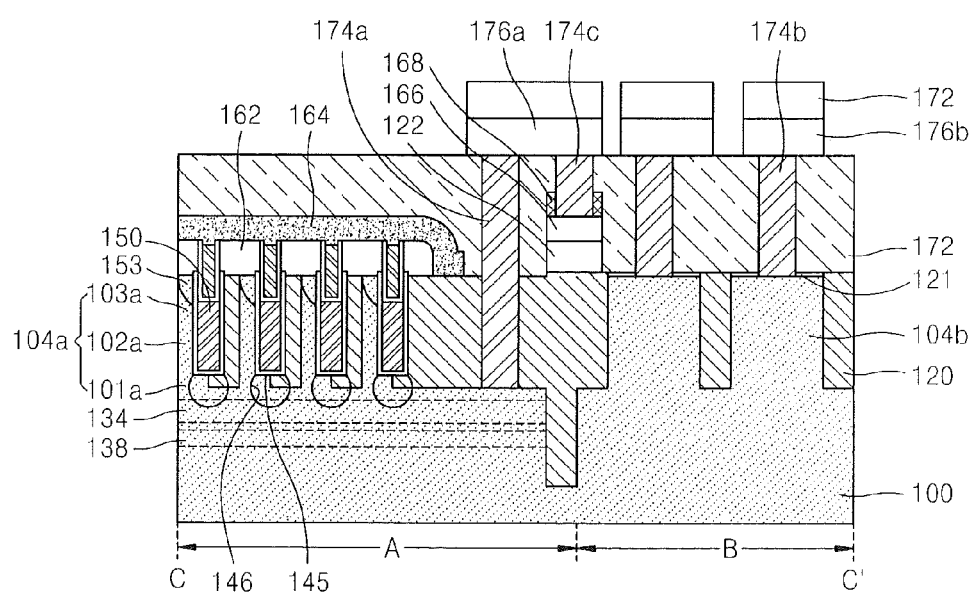
Figure 21D:
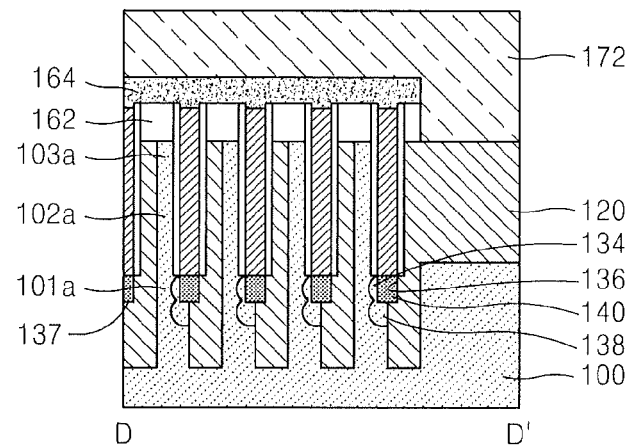
Figure 21E:
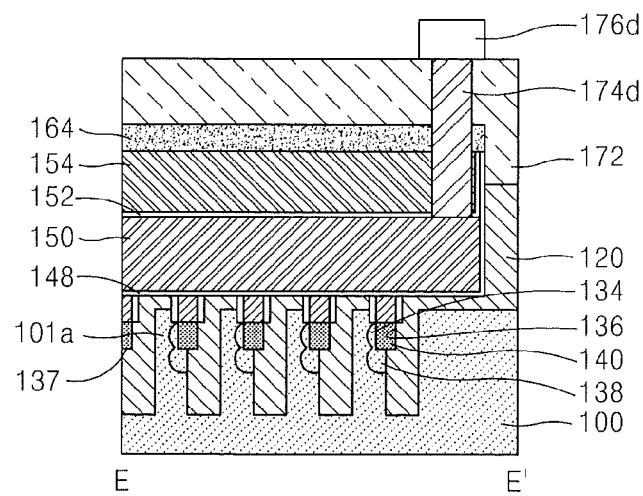

Referring to FIGS. 18B and 18E, the hard mask layer 124 may be selectively removed. For example, when the hard mask layer 124 includes a silicon nitride, the hard mask layer 124 may be selectively removed using phosphoric acid.

A stopper insulating layer 156 exposing the cell region A may be formed on the gate electrode layer 122. The stopper insulating layer 156 may be used as an etch stop layer in a subsequent etching process. For example, the stopper insulating layer 156 may include silicon nitride. Portions of the gate electrode layer 122 in the cell region A may be removed by using the stopper insulating layer 156 as an etching mask. For example, the portions of the gate electrode layer 122 may be removed through wet etching. The gate insulating layer 121 in the cell region A may also be removed.

Referring to FIGS. 19B through 19E, a plurality of cell pads 162 may be formed on the upper impurity regions 103a. For example, the cell pad 162 may be formed as a spacer by forming a conductive layer, for example, a poly silicon layer, between the second buried insulating layers 154 and then etching the conductive layer. In this case, the cell pads 162 may be formed by controlling the depths of the second buried insulating layers 154 and the thicknesses of the conductive layers, so that the cell pads 162 may have a form in which the second buried insulating layers 154 are substantially filled.

Accordingly, the cell pad 162 may be formed on the upper impurity region 103a, that is, on the second source/drain region, by a self-alignment method without performing an additional photolithography process. Meanwhile, etching may be stopped at the stopper insulating layer 156 in the peripheral circuit region B.

A second stopper insulating layer 164 covering the cell region A and exposing the peripheral circuit region B may be formed on the cell pads 162. For example, the second stopper insulating layer 164 may be formed by forming a silicon nitride layer on the cell region A and the peripheral circuit region B and then patterning the silicon nitride layer.

Referring to FIGS. 20B through 20E, a capping conductive layer 166 may be formed on the gate electrode layer 122 in the peripheral circuit region B, a hard mask layer 168 may be formed on the capping conductive layer 166, and a patterning process may be performed thereon, thereby forming a gate structure in which the capping conductive layer 166 and the hard mask layer 168 are sequentially stacked on the gate electrode layer 122 in the order stated. In this operation, etching may be stopped at the second stopper insulating layer 164 in the cell region A.

For example, the capping conductive layer 166 may include a material having surface resistance less than that of the gate electrode layer 122. For example, when the gate electrode layer 122 includes poly silicon, the capping conductive layer 166 may include metal silicide, metal, or a stacked structure thereof.

Referring to FIGS. 21B through 21E, an interlayer insulating layer 172 may be formed on the cell region A and the peripheral circuit region B. For example, the interlayer insulating layer 172 may include silicon oxide or an insulating material having a relatively low dielectric constant. The insulating material having a low dielectric constant may refer to an insulating material having a dielectric constant lower than that of a silicon oxide.

The interlayer insulating layer 172 is patterned, and contact holes (not shown) are formed, thereby forming first through fourth contact plugs 174a, 174b, 174c, and 174d filling the contact holes. For example, the first through fourth contact plugs 174a, 174b, 174c, and 174d may be formed by filling appropriate conductive layers in the contact holes and then planarizing the conductive layers.

The first contact plug 174a may be connected to the lower impurity region 101a, for example, the first source/drain region, of the cell region A. The second contact plug 174b may be connected to the planar active region 104b. The third contact plug 174c may be connected to the gate electrode layer 122. The fourth contact plug 174d may be connected to the word line 150.

A first wire line 176a may be formed to connect a part of the first contact plug 174a and the third contact plug 174c. A second wire line 176b may be formed to be connected to the second contact plug 174b. A third wire line 176d may be formed to be connected to the fourth contact plug 174d. For example, the first through third wire lines 176a, 176b, and 176d may be formed by forming appropriate conductive layers on the first through fourth contact plugs 174a, 174b, 174c, and 174d, forming a mask layer 178 on the conductive layers, and patterning the mask layer 178.

Referring to FIGS. 22B through 22E, a second interlayer insulating layer 179 may be formed to cover the first through third wire lines 176a, 176b, and 176d. A plurality of storage electrodes 182 may be formed to penetrate the first and second interlayer insulating layers 172 and 179 and the second stopper insulating layer 164, to extend, and to be connected to the cell pad 162. For example, the storage electrodes 182 may have a vertically extending cylindrical structure.

Figure 23:
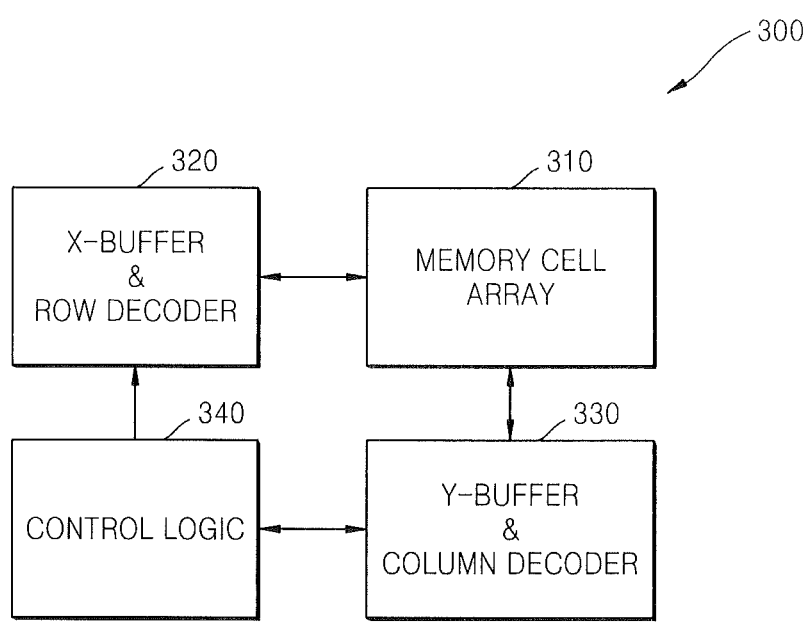
FIG. 23 is a block diagram of a memory chip according to an embodiment of the inventive concept.

FIG. 23 is a block diagram of a memory chip 300 according to an embodiment of the inventive concept.

Referring to FIG. 23, a memory cell array 310 may include any of the structures of the aforementioned semiconductor devices and/or memory devices. The memory cell array 310 may be connected to an X-buffer & row decoder 320 and a Y-buffer & column decoder 330 so as to transfer signals with the X-buffer & row decoder 320 and the Y-buffer & column decoder 330. Word lines of the memory cell array 310 may be connected to the X-buffer & row decoder 320, and bit lines of the memory cell array 310 may be connected to the Y-buffer & column decoder 330. A control logic 340 may be connected to the X-buffer & row decoder 320 and the Y-buffer & column decoder 330 so as to control the X-buffer & row decoder 320 and the Y-buffer & column decoder 330.

Figure 24:
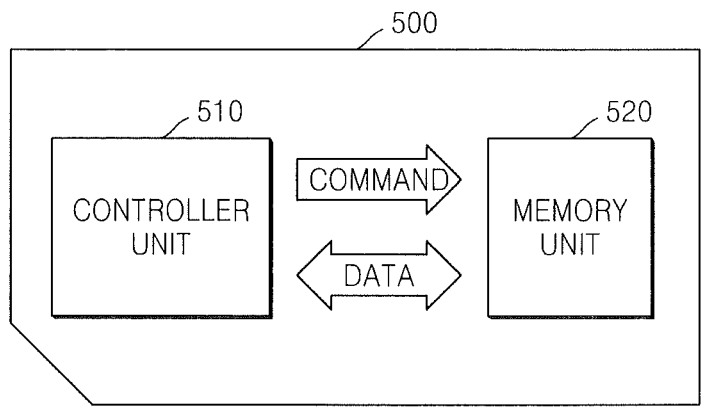
FIG. 24 is a block diagram of a memory chip according to an embodiment of the inventive concept.

FIG. 24 is a block diagram of a memory card 500 according to an embodiment of the inventive concept.

Referring to FIG. 24, a controller unit 510 and a memory unit 520 may transfer electrical signals with each other. For example, according to commands of the controller unit 510, the memory unit 520 and the controller unit 510 may exchange data with each other. Thus, the memory card 500 may store data in the memory unit 520 or output the data from the memory unit 520 to an external device. For example, the memory unit 520 may include a semiconductor device or a memory device according to any of the embodiments described herein.

The memory card 500 may be used as a data storage medium of various portable devices. For example, the memory card 500 may include a multi-media card (MMC) or a secure digital (SD) card.

Figure 25:
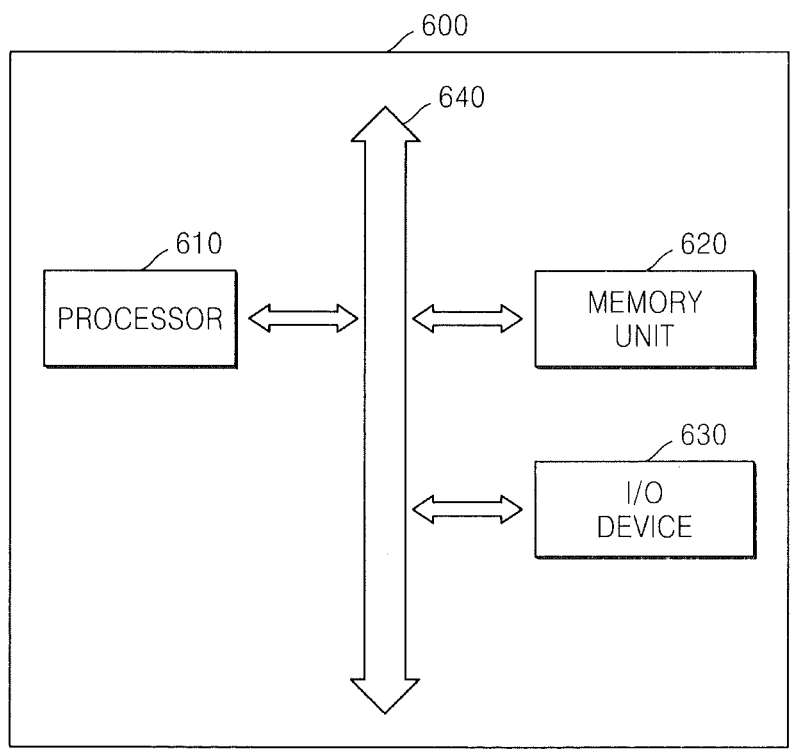
FIG. 25 is a block diagram of an electronic system according to an embodiment of the inventive concept.

FIG. 25 is a block diagram of an electronic system 600 according to an embodiment of the inventive concept.

Referring to FIG. 25, a processor 610, an input/output (I/O) device 630, and a memory unit 620 may perform data communication with one another through a bus 640. The processor 610 may execute a program and control the electronic system 600. The I/O device 630 may be used to input or output data of the electronic system 600. The electronic system 600 may be connected to external devices, for example, a personal computer (PC) or a network, using the I/O device 630 so as to exchange data with the external devices.

The memory unit 620 may store code and/or data for operating the processor 610. For example, the memory unit 620 may include any of the aforementioned semiconductor devices or memory devices described herein.

The electronic system 600 may be used in various electronic control devices requiring the memory unit 620. For example, the electronic system 600 may be used in mobile phones, moving picture experts group (MPEG) audio layer-3 (MP3) players, navigation devices, solid state disks (SSD), and/or household appliances.

Vertical type integrated circuit devices according to embodiments of the inventive concept can have a relatively small footprint on a substrate due to their vertical arrangement structure, and thus can be easily highly integrated. Also, in vertical type integrated circuit devices, a bit line is disposed to contact a first side wall of a pillar. Thus, vertical type integrated circuit devices may provide a low resistance structure in which a cross-sectional area of the vertical type integrated circuit device is wider and less complex as compared to a structure in which the bit line surrounds the pillar. Accordingly, vertical type integrated circuit devices can be used in products to provide high reliability and high performance.

According to methods of manufacturing vertical type integrated circuit devices, a source/drain region can be formed in a self-aligned manner or structure, and also, cell pads for connecting a storage electrode can be formed in a self-aligned manner or structure. Accordingly, methods according to embodiments of the inventive concept may be relatively economical.

While the inventive concept has been particularly shown and described with reference to exemplary embodiments thereof, it will be understood that various changes in form and details may be made therein without departing from the spirit and scope of the following claims.

What is claimed is:

1. A vertical type integrated circuit device comprising:
   a substrate;
   a pillar vertically protruding from the substrate, the pillar comprising a lower impurity region and an upper impurity region therein and a vertical channel region therebetween, wherein a portion of the pillar including the lower impurity region therein includes a first mesa and a second mesa laterally extending therefrom;
a bit line extending on the first mesa and on a first sidewall of the pillar and electrically contacting the lower impurity region, wherein the first mesa laterally extends in a direction perpendicular to the bit line, and wherein the bit line directly contacts the first mesa along a bottom surface thereof and directly contacts the lower impurity region along a sidewall thereof;
a word line extending on the second mesa and on a second sidewall of the pillar that is perpendicular to the first sidewall and adjacent the vertical channel region, the word line linearly extending in the direction perpendicular to the bit line and spaced apart from the second mesa; and
a gate insulating layer extending on the second sidewall between the vertical channel region and the word line, and between the second mesa and the word line.

2. The device of claim 1, wherein a cross-sectional area of the lower impurity region is larger than cross-sectional areas of the vertical channel region and the upper impurity region.

3. The device of claim 2, wherein a cross-sectional area of the pillar decreases in a direction away from the substrate.

4. The device of claim 1, wherein the substrate and the pillar comprise a same semiconductor material.

5. The device of claim 1, further comprising:
a storage electrode on a portion of the pillar including the upper impurity region therein.

6. The device of claim 5, further comprising:
a cell pad between the portion of the pillar including the upper impurity region and the storage electrode.

7. The device of claim 1, further comprising:
a plurality of pillars vertically protruding from the substrate along the bit line, wherein the plurality of pillars respectively comprise upper and lower impurity regions therein and vertical channel regions therebetween; and
a plurality of word lines respectively extending on second sidewalls of respective ones of the plurality of pillars adjacent to the respective vertical channel regions therein, wherein the word line comprises one of the plurality of word lines, and wherein the plurality of word lines extend in the direction perpendicular to the bit line.

8. The device of claim 7, wherein the lower impurity regions of the plurality of pillars are electrically connected.

9. The device of claim 1, further comprising:
a plurality of pillars vertically protruding from the substrate along the word line, the plurality of pillars respectively comprising upper and lower impurity regions therein and vertical channel regions therebetween; and
a plurality of bit lines respectively extending on first sidewalls of respective ones of the plurality of pillars, wherein the bit line comprises one of the plurality of bit lines, and wherein the plurality of bit lines extend in a direction perpendicular to the word line.

10. The device of claim 1, wherein the first sidewall including the bit line directly thereon is free of the word line, and wherein the second sidewall including the word line thereon is free of the bit line.

11. A memory device, comprising:
a substrate comprising a cell region and a peripheral circuit region;
a vertical type semiconductor device on the cell region; and
a planar type semiconductor device on the peripheral circuit region,
wherein the vertical type semiconductor device comprises:
a semiconductor pillar protruding from the cell region in a vertical direction and comprising an upper impurity region, a lower impurity region, and a vertical channel region therebetween, wherein the semiconductor pillar includes a first mesa and a second mesa laterally extending therefrom;
a bit line disposed on the first mesa and on a first sidewall of the semiconductor pillar to electrically contact the lower impurity region, wherein the bit line directly contacts the first mesa along a bottom surface thereof and directly contacts the lower impurity region along a sidewall thereof;
a word line disposed on the second mesa and on a second sidewall of the semiconductor pillar that is perpendicular to the first sidewall and adjacent the vertical channel region, the word line linearly extending in a direction substantially perpendicular to the bit line;
a gate insulating layer extending on the second sidewall between the vertical channel region and the word line and between the second mesa and the word line; and
a storage electrode disposed on the upper impurity region.

12. The memory device of claim 11, wherein the planar type semiconductor device comprises a planar type gate electrode on the peripheral circuit region.

13. The memory device of claim 12, wherein the planar type gate electrode is disposed over the word line.

14. A vertical type semiconductor device comprising:
a substrate;
a semiconductor pillar protruding from the substrate, the pillar comprising a lower impurity region and an upper impurity region therein and a vertical channel region therebetween, wherein a base of the pillar includes a first mesa laterally extending therefrom in a first direction and a second mesa laterally extending therefrom in a second direction substantially perpendicular to the first direction, the first and second mesas including the lower impurity region therein;
a bit line having a bottom surface thereof directly on the first mesa and extending in the second direction, the bit line having a sidewall thereof directly contacting the lower impurity region along a first sidewall of the pillar;
a word line on the second mesa adjacent the vertical channel region, the word line extending in the first direction along a second sidewall of the pillar that is perpendicular to the first sidewall, wherein the word line is spaced apart from the first mesa; and
a gate insulating layer extending between the vertical channel region and the word line and between the lower impurity region and the word line.

* * * * *